United States Patent [19]
Fujikawa et al.

[11] Patent Number: 5,704,493
[45] Date of Patent: Jan. 6, 1998

[54] SUBSTRATE HOLDER

[75] Inventors: Kazunori Fujikawa; Kenji Yasui; Hisao Nishizawa, all of Shiga, Japan

[73] Assignee: Dainippon Screen Mfg. Co., Ltd., Japan

[21] Appl. No.: 578,860

[22] Filed: Dec. 27, 1995

[51] Int. Cl.[6] .................................................. A47F 7/00
[52] U.S. Cl. .............................. 211/41; 206/454; 118/500
[58] Field of Search ........................ 211/40, 41; 206/307, 206/308.1, 309, 387.15, 454; D6/407, 629, 630; D13/182; 118/500; 269/87.2

[56] References Cited

U.S. PATENT DOCUMENTS

| | | | |
|---|---|---|---|
| 4,566,839 | 1/1986 | Butler | 269/903 X |
| 4,572,101 | 2/1986 | Lee | 206/454 X |
| 4,654,967 | 4/1987 | Thenner | 269/903 X |
| 4,840,530 | 6/1989 | Nguyen | 206/454 X |
| 4,872,554 | 10/1989 | Quememoen | 118/500 X |
| 4,981,222 | 1/1991 | Lee | 118/500 X |
| 5,033,406 | 7/1991 | Lee | 118/500 |
| 5,370,142 | 12/1994 | Nishi et al. | 118/500 X |
| 5,472,099 | 12/1995 | Terashima | 206/454 X |
| 5,534,074 | 7/1996 | Koons | 206/454 X |

*Primary Examiner*—Robert W. Gibson, Jr.
*Attorney, Agent, or Firm*—Ostrolenk, Faber, Gerb & Soffen, LLP

[57] ABSTRACT

Semiconductor substrates are held by a substrate holder having a parallel arrangement of bridges, and are capable of being dipped in processing liquids by the holder. Each bridge has an alternate arrangement of teeth and valleys to define Y-shaped notches. Vent holes are formed in the bottoms of the notches for ready drainage of processing liquids. The substrates are held in the notches while contacting only the walls of the notches. Thus, there is minimum contact between the substrates and the substrate holder. When the holder is lifted up from the processing liquid, part of the processing liquid remaining around the contacts between the substrates and the valleys drain through the vent holes, which attributes to the rapid drying of the substrates.

18 Claims, 21 Drawing Sheets

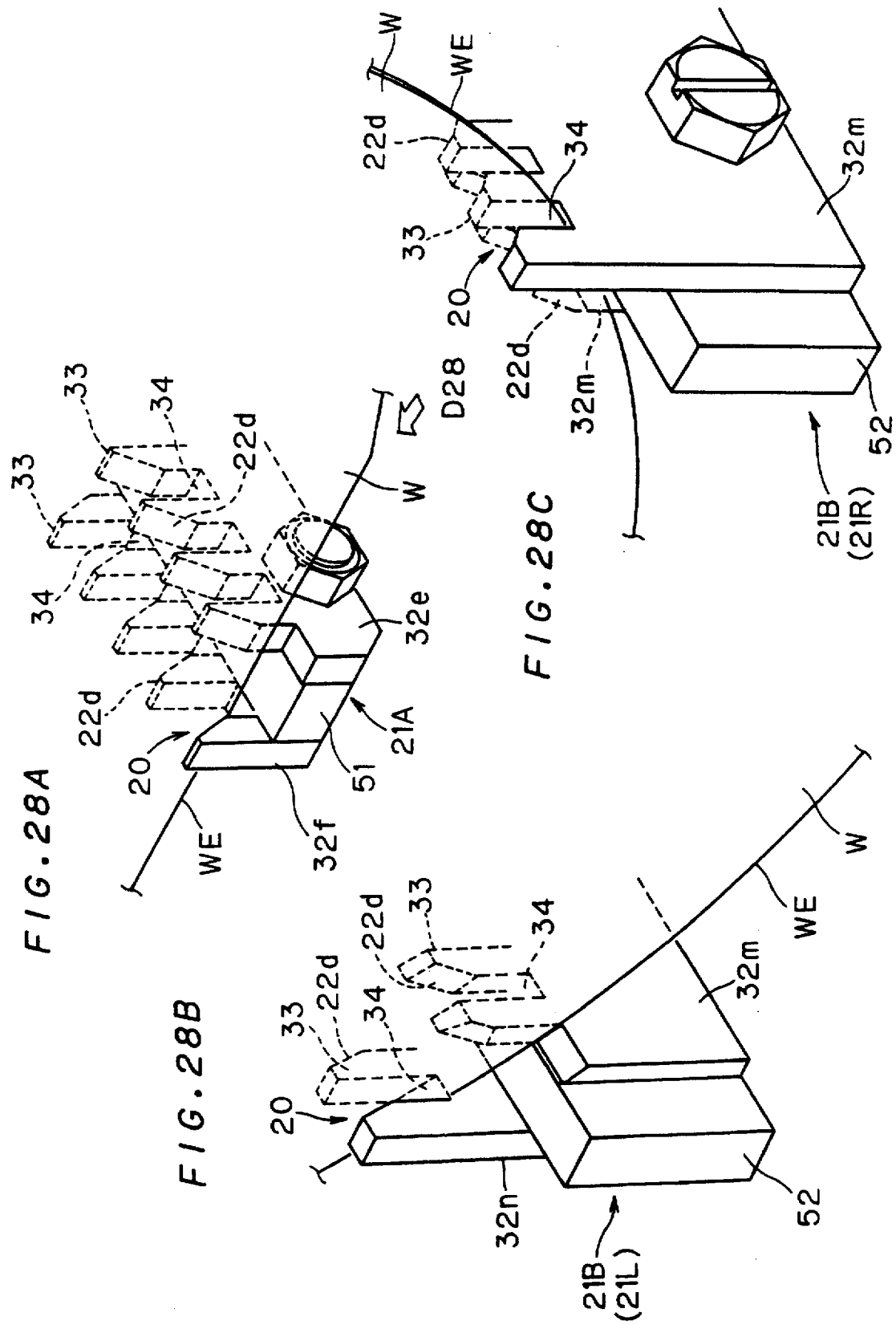

SUBSTRATE HOLDER

FIELD OF THE INVENTION

The present invention relates to a substrate holder for holding a parallel array of substrates standing straight, which is usable in surface processes of semiconductor substrates, glass substrates for liquid-crystal displays and the like. More particularly, the present invention relates to an improvement in reducing the contact areas of the substrates and the holder and in release of the processing liquid from the contacts. The surface process may be a wet process, a dry process or a rinsing process. The present invention is applicable to wafer boats, wafer chucks and the like.

BACKGROUND OF THE INVENTION

FIG. 1A illustrates a conventional wafer boat 520, and FIG. 1B is a partial enlarged view of FIG. 1A viewed from the direction IB in FIG. 1A. The wafer boat 520 holds semiconductor substrates or wafers W standing straight and arranged in parallel. The wafer boat 520 comprises bridges 521A and 521B whose both ends are fixed to frames 526. As shown in FIG. 1B, a number of Y-shaped notches 522 are formed in parallel on each bridge 521. The wafer boat 520 holding the substrates W is usable for dipping the substrates W into a processing liquid in a processing bath. After the process is completed, the wafer boat 520 is lifted out of the processing bath.

FIG. 2 illustrates a conventional wafer chuck 530 for chucking substrates W with bridges 531 on which Y-shaped or V-shaped notches are formed. The wafer chuck 530 is also usable for dipping the substrates W into a processing liquid.

In conventional use, the processing liquid remains about the areas of contact of the substrates W and the bridges 521 or 531, and substantially remains in place when the wafer boat 520 or the wafer chuck 530 is lifted out of the processing bath, because the processing liquid adheres to the contacts because of capillarity phenomenon.

As a result, the processing liquid at the contacts is carried to a next process with the substrates W, which results in a problem of cross-contamination. Contaminations are easily accumulated between the substrates W and the notches 522. Further, when the wafer boat 520 or the wafer chuck 530 holding the substrates W is subjected to a drying process, the processing liquid around the contacts does not easily evaporate, thus the drying process of the substrates W is delayed.

FIG. 3 illustrates another conventional wafer holder 540 having holding bridges 541 for holding glass substrates GS. Each bridge 541 has saw-teeth 542A or 542B and the directions of saw-teeth 542A and 542B are alternated between the adjacent bridges 541. In the structure of FIG. 3, many bridges must be provided in the holder 540 because the alternate saw-teeth 542A and 542B must be paired. As a result, the holder 540 and an accompanying processing bath are relatively large in size. If only the bottom bridges are provided in wafer holder 540, the substrates GS would fall down.

SUMMARY OF THE INVENTION

The present invention is directed to a substrate holder comprising bridges arrayed in parallel for holding substrates standing upright to process respective surfaces of the substrates in processing liquids.

According to the present invention, each of the bridges has a bridge body and teeth arrayed on the bridge body and defining valleys between the teeth. The valleys are capable of receiving substrates. Vent holes, each having a diameter larger than the respective thickness of the substrates, are formed in the bottoms of the valleys.

At least a portion of any processing liquid in the areas of contact between the substrates and the valleys can escape through the vent hole, so that contamination of the substrates, due to the carryover of processing liquids, is prevented. When the present invention is adapted to a holder for removing substrates from the processing liquid and the substrates are then subjected to a drying process, the time required for drying is reduced. The vent holes are easily disposed in the notches.

In an aspect of the present invention, each of the bridges has a bridge body, and teeth are arrayed on the bridge body to define valleys between the teeth. The valleys are capable of receiving substrates. Side recesses are formed on at least one of the sides of the bridge body so that steps are defined between the side recesses and bottoms of the valleys.

Processing liquids can be drained from the substrate holders through the side recesses. Since the width of the valleys can be reduced, the contact area between the substrates and the holder can also be reduced.

In another aspect of the present invention, the widths of the valleys are larger than the thickness of the substrates, and projections are provided on the walls of the valleys. Thus, the contact area between the substrates and the holder can be substantially reduced.

In another aspect of the present invention, each of the bridges has a plurality of plates standing upright and arranged in parallel, and means for defining gaps between the plurality of plates. Each of the plurality of plates has a plate body, and teeth arrayed on the plate body and defining Y-shaped or V-shaped valleys between the teeth. The valleys are capable of receiving the substrates.

The contact between the substrates and the holder is substantially attained at lines or edges of the teeth.

According to a preferred embodiment of the present invention, a substrate holder comprises: a) a first plate on which first teeth are directed upwardly and define first valleys therebetween; b) a second plate on which second teeth are directed upwardly and define second valleys therebetween; and c) a third plate on which third teeth are directed upwardly and define third valleys therebetween.

The second and third plates are arranged in parallel and the first plate is inserted between the second and third plates, parallel thereto. The first, second and third valleys are staggered to thereby define a means for holding the substrates. The substrates are held by the first, second and third plates such that the first major surfaces of the substrates are supported by walls of the first valleys only, and the second major surfaces of the substrates are supported by walls of the second and third valleys only.

Since respective teeth contact only one of first and second major surfaces of each substrate, processing liquid remaining at the contact areas is reduced.

Accordingly, an object of the present invention is to provide a substrate holder from which processing liquid can be easily drained.

Another object is to prevent cross-contamination by providing ready drainage of any processing liquids.

A still further object of the present invention is to prevent increase in the size of the substrate holder.

A further object is to prevent accumulation of contamination between substrates and the holder.

These and other objects, features, aspects and advantages of the present invention will become more apparent from the following detailed description of the present invention when taken in conjunction with the accompanying drawings.

BRIEF DESCRIPTION OF THE DRAWINGS

FIG. 28A illustrates details of the center bridge;

FIG. 28B illustrates details of the left side bridge.

FIG. 28C illustrates details of the right side bridge.

DESCRIPTION OF PREFERRED EMBODIMENTS

1. First Preferred Embodiment

1-1. Overall Structure

Figure 1A:
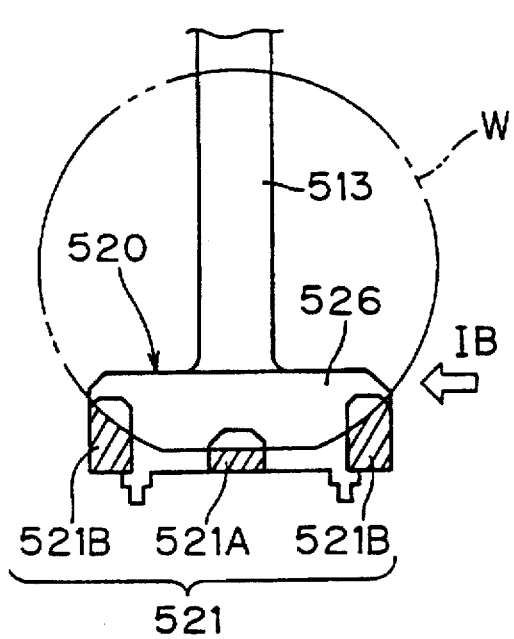
FIG. 1A is a sectional view illustrating a conventional wafer boat.
Figure 1B:
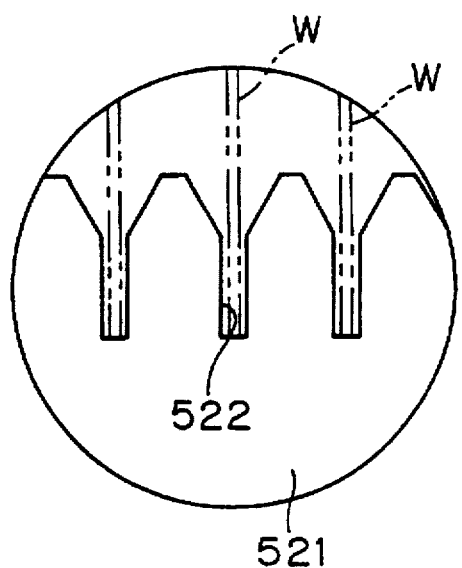
FIG. 1B is a partial enlarged view of FIG. 1A viewed from the direction IB in FIG. 1A.
Figure 2:
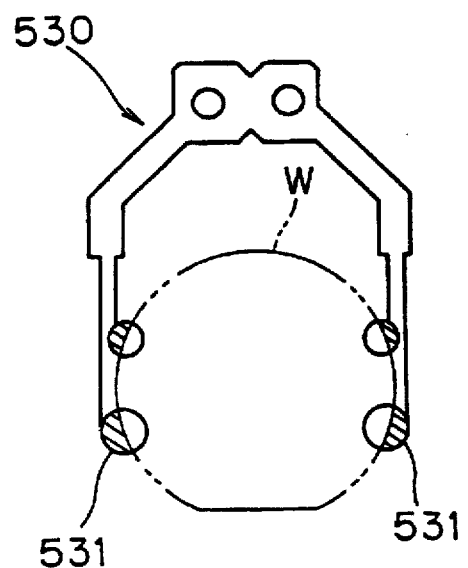
FIG. 2 is a sectional view illustrating a conventional wafer chuck.
Figure 3:
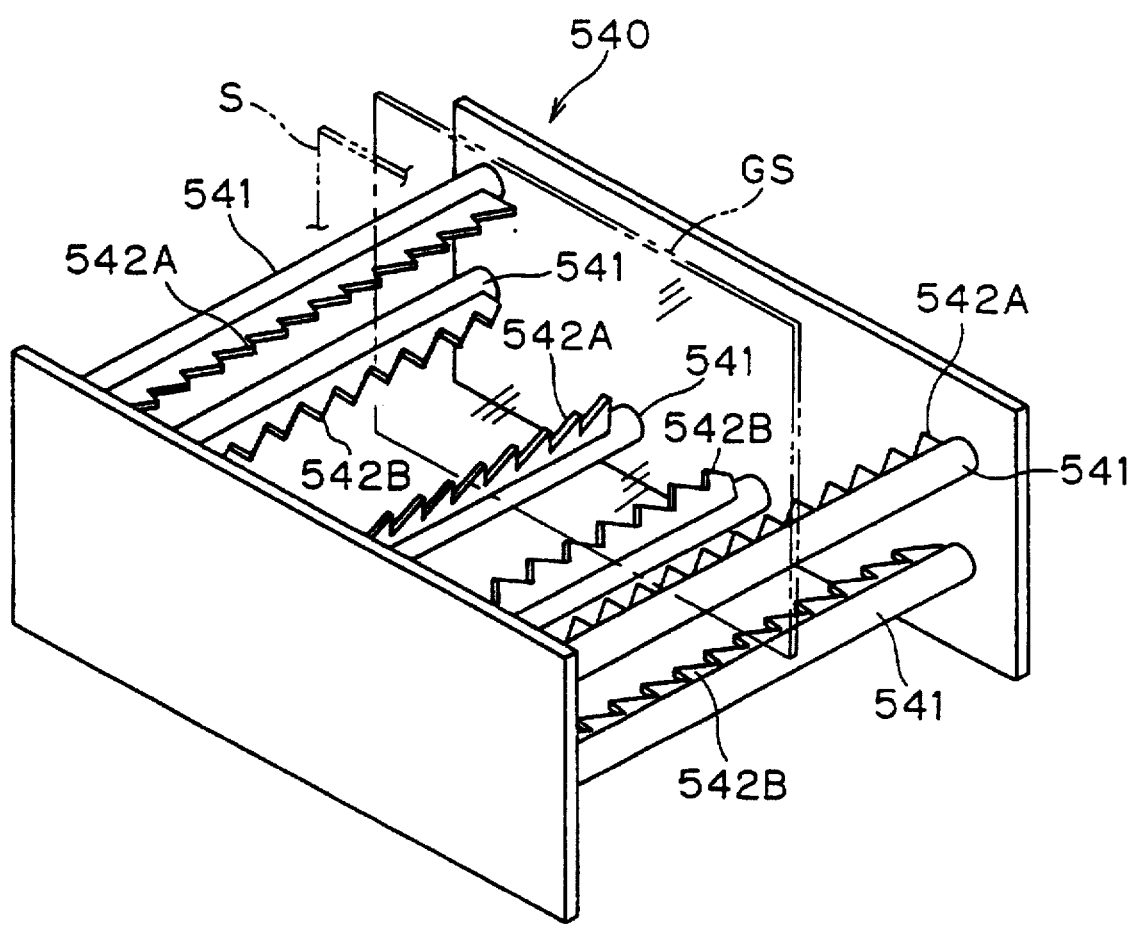
FIG. 3 is a perspective view illustrating a conventional wafer holder.
Figure 4:
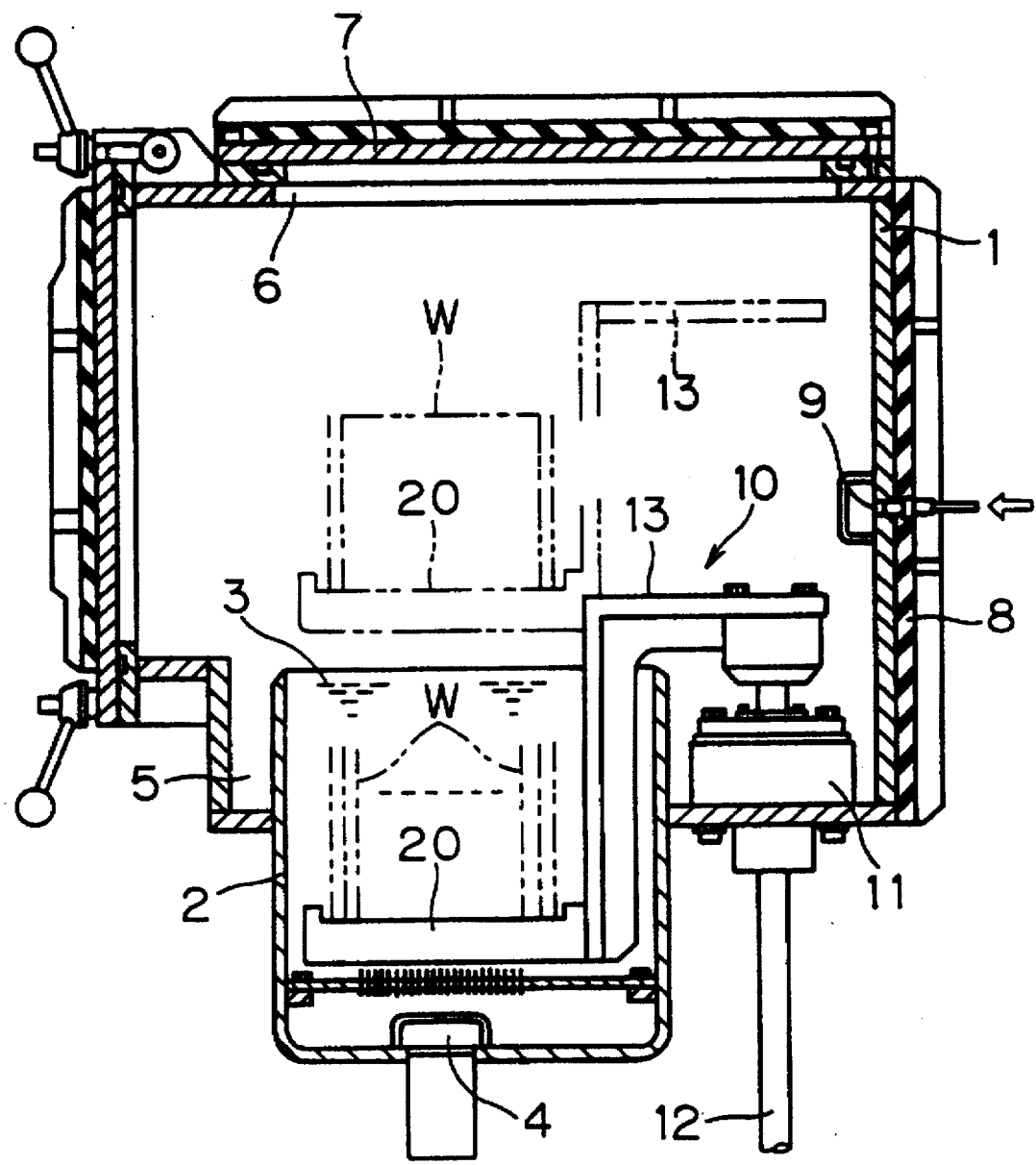
FIG. 4 is a sectional view of a processing unit according to a preferred embodiment of the present invention.

FIG. 4 is a cross-sectional view of a processing unit 100 used for rinsing and drying semiconductor substrates or wafers W, in which a wafer holder 20 is provided of a preferred embodiment of the present invention. The processing unit 100 comprises a chamber 1 which can be sealed by closing a door 7 covering a window 6. An overflow type rinsing bath 3 is provided in the bottom of the room defined by the chamber 1. The wafer holder 20 holds a parallel array of semiconductor substrates W standing vertically upright and arranged in parallel. A lifter 10 includes an L-shaped arm 13 fixed to a rod 12 which is supported by a thrust bearing 11. The lifter 10 is coupled to the holder 20 to dip the substrates W into a rinsing liquid 3 and then lift the substrates W out of the rinsing bath 2 together with the holder 20. The rinsing liquid 3 is supplied to the rinsing bath 2 through a supply port 4, and the rinsing liquid overflowing from the bath 2 is received at a groove 5.

The substrates W, after being processed in the processing liquid 3 and lifted from the processing liquid 3, are subjected to an alcohol vapor in vacuum, whereby the substrates W are dried. The alcohol vapor is supplied from a port 9. The room in the chamber 1 is controlled in temperature by a rubber heater 8.

Figure 5:
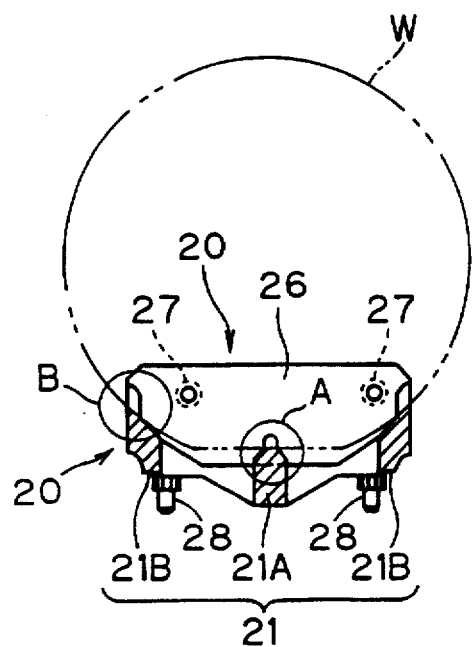
FIG. 5 is a sectional view of a wafer boat included in the processing unit of FIG. 4.
Figure 6:
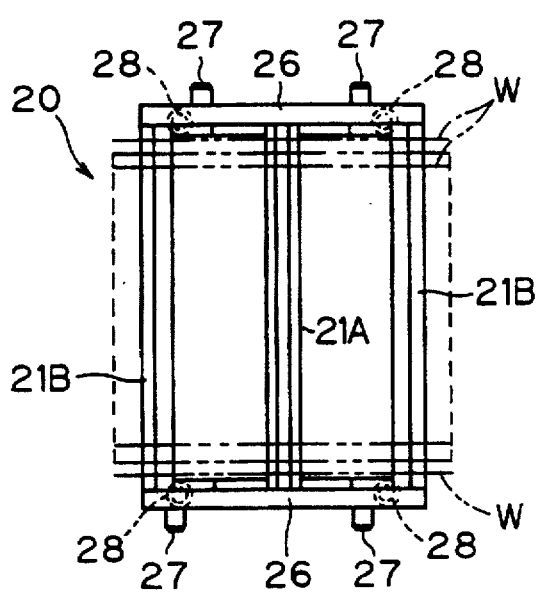
FIG. 6 a plan view of the wafer boat of FIG. 5.

With reference to FIGS. 5 and 6, the wafer boat 20 comprises three bridges 21A and 21B and respective ends of the three bridges 21 (21A and 21B) are fixed to a pair of frames 26. The substrates W are held on the bridges 21A and 21B while standing vertically upright and arranged in parallel.

A pair of pins 27 project from each frame 26, so that the lifter 10 (FIG. 4) can attach the pins 27. Four legs 28 project from the bottom of the frames 26, whereby wafer boat 20 can be placed on the bottom of the processing bath 2 or on a horizontal stage without inclining the substrates W. The length of the legs 28 is adjustable to ensure horizontal placement.

1-2. First Embodiment of Center Bridge

Figure 7A:
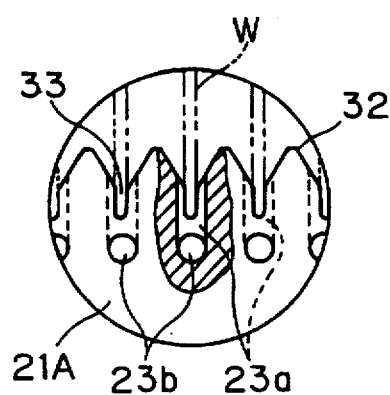
FIG. 7A a partial enlarged view of a center bridge with portions omitted.
Figure 7B:
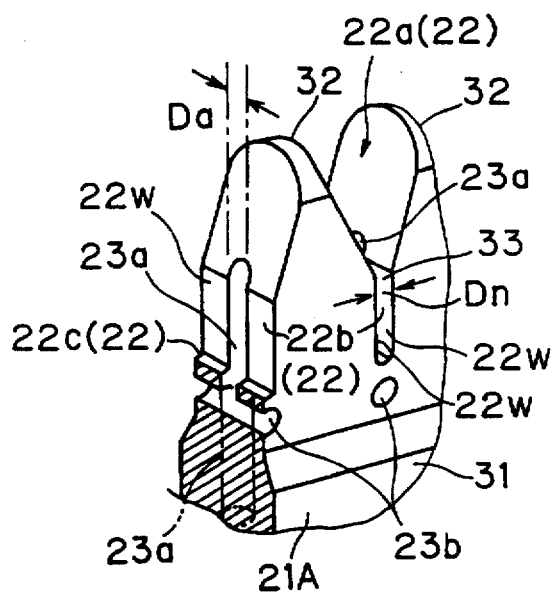
FIG. 7B is a partial perspective view of the center bridge of FIG. 7A.

With reference to FIGS. 7A and 7B, the center bridge 21A has a bridge body 31 having a periodic arrangement of teeth (projections) 32 thereon. The teeth 32 define a periodic array of valleys (recesses) 33 therebetween, thus an alternate arrangement of teeth 32 and valleys 33 are provided. The valleys 33 are in the form of Y-shaped vertical notches 22 in the center bridge 21A. The notches 22 are arrayed periodically and accept the substrates W in an upright position. Each vertical notch 22 consists of a V-shaped top portion 22a, a straight portion 22b and a bottom portion 22c. A vertical vent hole 23a for drawing the rinsing liquid from the gaps between the substrate W and a notch wall 22w is formed on each notch wall 22w. The vertical vent hole 23a extends in the top portion 22a, the straight portion 22b and the bottom portion 22c of the vertical notch 22. The vertical vent hold 23a is a cylindrical hole having a diameter Da, which is larger than the gaps Dn between adjacent notch walls 22w at the straight portion 22b of vertical notch 22. Accordingly, the area of the notch wall 22w contacting the substrate W is reduced at the straight portion 22b and the rinsing liquid is readily drained from the vertical notch 22 through vertical vent hole 23a.

A horizontal vent hole 23b is formed through the center bridge 21A under the bottom of the vertical notch 22. The vertical vent hole 23a opens to the horizontal vent hole 23b, whereby the rinsing liquid can be drained through vertical hole 23a and horizontal hole 23b. The horizontal hole 23b is also a cylindrical hole. The horizontal hole 23b is nearly horizontal but is slightly inclined to both openings thereof in order to more readily drain the rinsing liquid. The bottom of the vertical notch 22 is also slightly inclined to both sides.

As described above, the preferred embodiment of the present invention shown in FIGS. 7A and 7B is constructed such that the vent holes 23a and 23b are formed on and under each vertical notch 22 of the center bridge 21A. Accordingly, when the parallel array of upright standing substrates W are lifted from the rinsing liquid 3 with the wafer boat 20, the part of the rinsing liquid present on the notches 22 drains by gravity through the vent holes 23a and 23b. As a result, only a very small amount of rinsing liquid remains in the straight portion 22b of each vertical notch 22.

According to the preferred embodiment of FIGS. 7A and 7B, cross-contamination due to carrying-over of the rinsing liquid (processing liquid, in general) is effectively prevented in processing units of the immersion type. Further, when the substrates W are subjected to a drying process in the processing unit 100 of FIG. 4, the drying process of substrates W is accelerated. These advantages are common to other preferred embodiments of the present invention subsequently described.

In the preferred embodiment of FIGS. 7A and 7B, each vertical notch 22 of the center bridge 21A is Y-shaped, so that inclination or displacement of the substrates W is prevented, while reducing the contact area of the substrates W and the notch walls. Further, the vent holes 23a and 23b according to the preferred embodiment are easily provided in a conventional bridge for holding substrates by forming holes therein.

The notches 22 in the center bridge 21A may be V-shaped since notches of such shape can hold a parallel array of upright standing substrates W. Further, vertical vent hole 23a may be formed so as to pass through the center bridge 21A and open at the bottom of the bridge 21A, as illustrated by the dot-dot-dash lines in FIG. 7B. It is sufficient for accelerating the drainage of the processing liquid and for preventing the occurrence of capillarity action if the diameter Da of each vent hole 23a, 23b is larger than the thickness of each substrate w, even though the diameter Da is not larger than the gaps Dn between adjacent notch walls 22w.

1-3. Second Embodiment of the Center Bridge

Figure 8A:
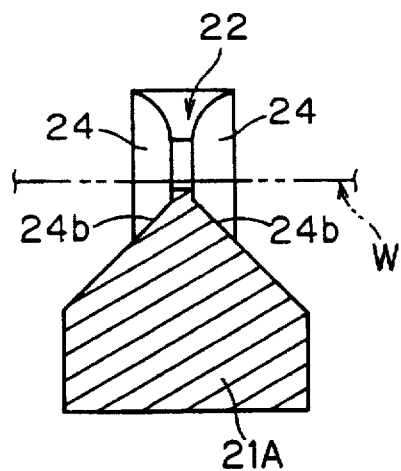
FIG. 8A is a front cross-sectional view of a part of a center bridge included in a substrate holder according to another preferred embodiment of the present invention.
Figure 8C:
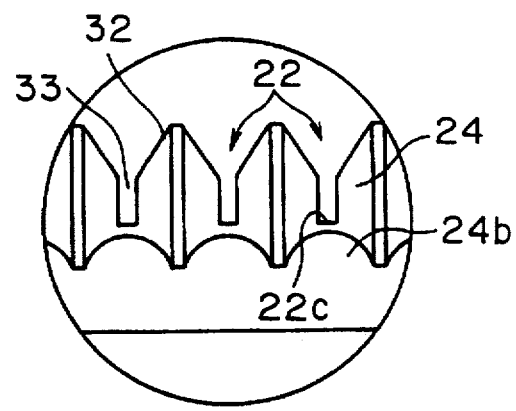
FIG. 8C is an enlarged view of a part of the center bridge of FIG. 8A.
Figure 8B:
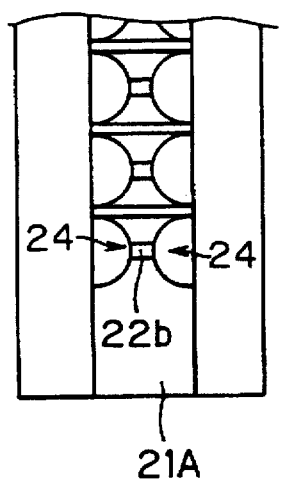
FIG. 8B is a plan view of a part of the center bridge of FIG. 8A.
Figure 8D:
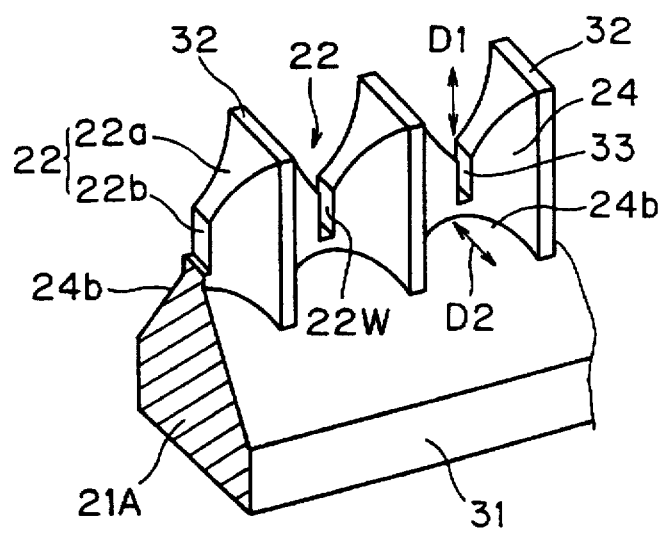
FIG. 8D is an enlarged perspective view of a part of the center bridge of FIG. 8A.

FIGS. 8A to 8D illustrate another preferred embodiment of the center bridge 21A, wherein FIG. 8A is a front cross-sectional view, FIG. 8B is a plan view, FIG. 8C is an enlarged view and FIG. 8D is an enlarged perspective view of a part of the center bridge 21A. The center bridge 21A is constructed such that side notches or recesses 24B, each having the shape of a partial cylinder, are formed on both sides of each vertical notch 22. Preferably, the depth D2 of each side notch 24b is nearly equal to the depth D1 of the top portion 22a (V-shaped portion) of the vertical notch 22. Each side vent recess 24 extends from the top portion 22a to the bottom portion 22c of the vertical notch 22, and the bottom 24b of each side notch 24 is lower than the bottom portion 22c of the vertical notch 22. A step is defined between the bottom 24b of each side notch 24 and the bottom of the vertical notch 22, and the respective bottoms 24b of side notches 24 are inclined downward to both sides to define slopes. The side notches 24 are effective to shorten the depth of the straight portion 22b of each vertical notch 22 and to reduce the contacts of the substrate W and the notch wall 22w on the straight portion 22b.

Accordingly, when the parallel array of the upright standing substrates W are lifted from the rinsing liquid 3 with the wafer boat 20, the portion of the rinsing liquid present in the notches 22 drains by gravity through the straight portion 22b and the side notch 24. As a result, only a very small amount of rinsing liquid remains in the straight portion 22b of each vertical notch 22.

1-4. First Embodiment of the Side Bridges

Figure 9A:
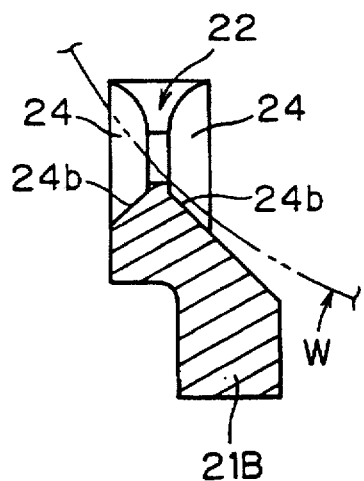
FIG. 9A is a front cross-sectional view of a part of a side bridge included in the substrate holder.
Figure 9C:
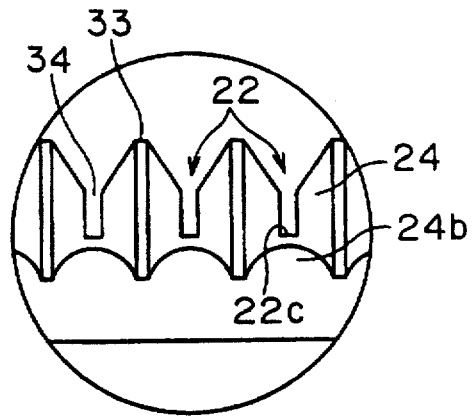
FIG. 9C is an enlarged view of a part of the side bridge of FIG. 9A.
Figure 9B:
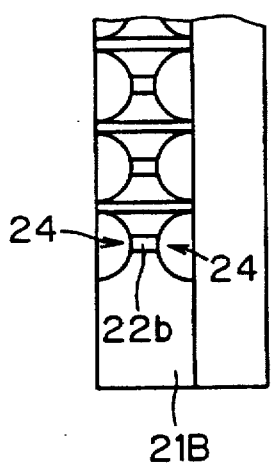
FIG. 9B is a plan view of a part of the side bridge of FIG. 9A.
Figure 9D:
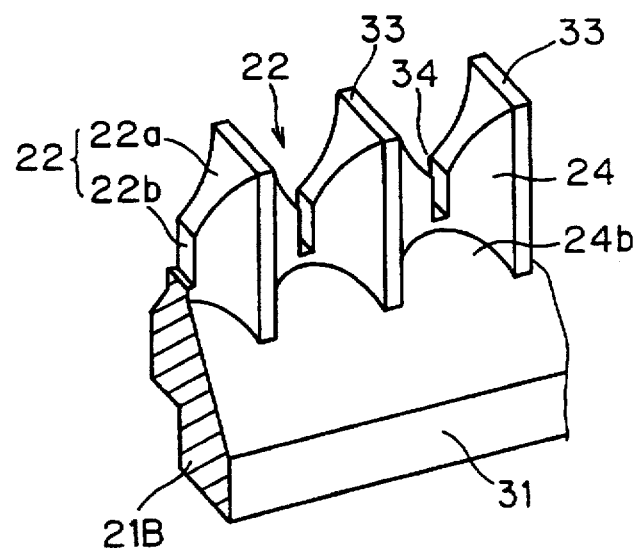
FIG. 9D is an enlarged perspective view of a part of the side bridge of FIG. 9A.

FIGS. 9A to 9D illustrate a preferred embodiment of the side bridge 21B of FIGS. 5 and 6, wherein FIG. 9A is a front cross-sectional view, FIG. 9B is a plan view, FIG. 9C is an enlarged view of a portion of FIG. 5, and FIG. 9D is an enlarged perspective view of a part of side bridge 21B. Although only the left one of the two side bridges of FIG. 5A is illustrated in FIGS. 9A to 9D, the right one is a mirror image of the left one. The principle of mirror symmetry is applied to other embodiments of the side bridges subsequently described.

The side bridge 21B is such that side notches 24b are formed on both sides of the Y-shaped vertical notches 22, as they were with respect to the center bridge 21A. The other features of the side bridge 21B will be understood by those skilled in the art from FIGS. 9A to 9D and the description for the center bridge 21A. The portion of the rinsing liquid present at the notches 22 drains by gravity through the straight portion 22b and the side notch 24. As a result, only a very small amount of rinsing liquid remains at the straight portion 22b of each vertical notch 22.

1-5. Second Embodiment of the Side Bridges

Figure 10A:
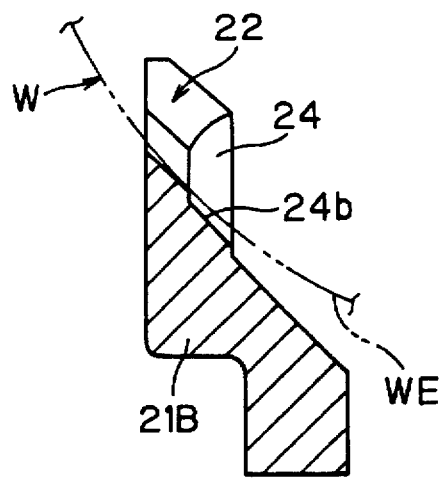
FIG. 10A a front cross-sectional view of a part of another example of a side bridge.
Figure 10B:
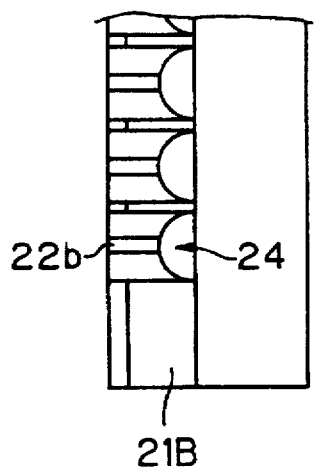
FIG. 10B a plan view of a part of the side bridge of FIG. 10A.
Figure 10C:
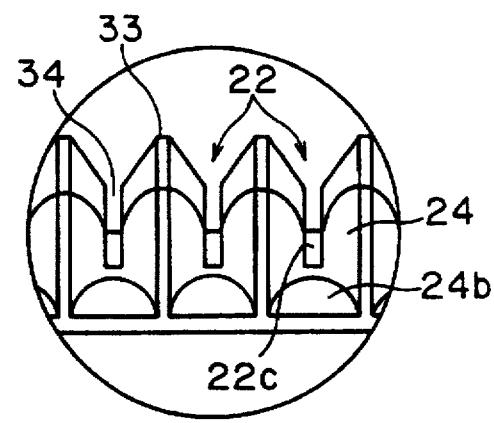
FIG. 10C is an enlarged view of a part of the side bridge of FIG. 10A.
Figure 10D:
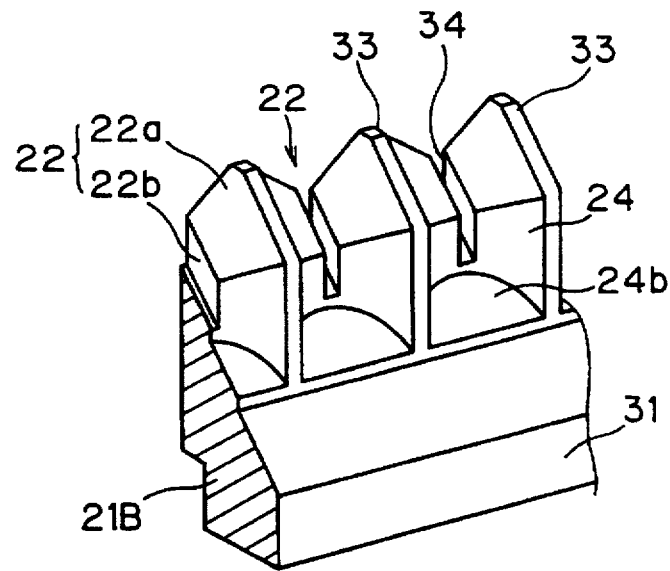
FIG. 10D is an enlarged perspective view of a part of the side bridge of FIG. 10A.

FIGS. 10A to 10D illustrate another preferred embodiment of the side bridge 21B, wherein FIG. 10A is a front cross-sectional view, FIG. 10B is a plan view, FIG. 10C is an enlarged view, and FIG. 10 is an enlarged perspective view of a part of the side bridge 21B. The side bridge 21B is such that a side notch 24b is formed on only one side of the Y-shaped vertical notches 22, i.e., on the side near to the center bridge 21A (see FIG. 5). The bottom of the vertical notch 22 is inclined downward along the substrate edge WE. The other features of the embodiment of side bridge 21B will be understood by those skilled in the art from FIGS. 10A to 10D.

Also with respect to the embodiment of side bridge 21B shown in FIGS. 10A to 10D, its construction is to ensure that only a very small amount of rinsing liquid remains on each vertical notch 22.

2. Second Preferred Embodiment

Figure 11A:
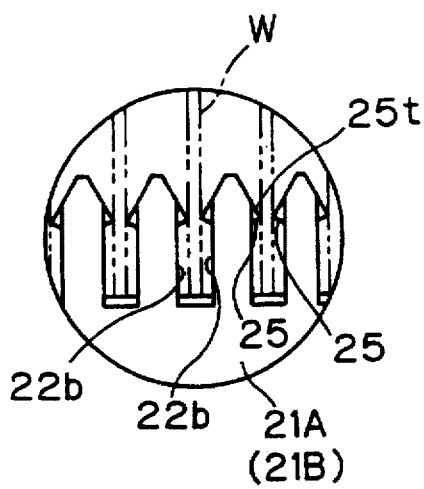
FIG. 11A is a side view of another example of bridges.
Figure 11B:
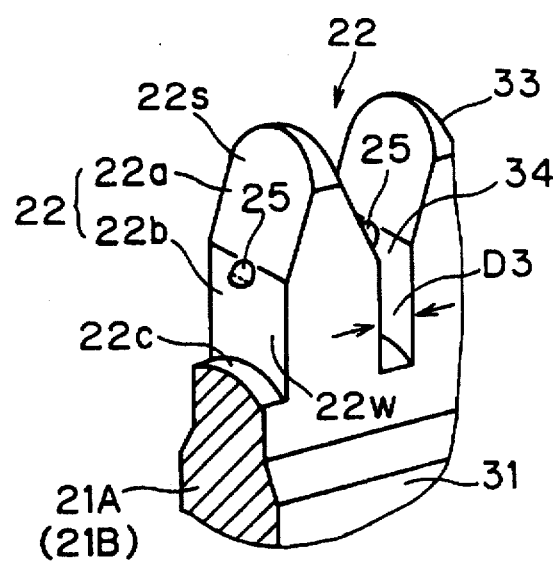
FIG. 11B is an enlarged perspective view of the example of bridges of FIG. 11A.

FIGS. 11A and 11B illustrate a center bridge 21A and side bridges 21B according to a second preferred embodiment of the present invention. FIG. 11A is a side view and FIG. 11b is an enlarged perspective view of the top structure of each bridge, which is common to the center bridge 21A and the side bridges 21B.

A periodic array of Y-shaped vertical notches 22 are formed in the bridges 21A, 21B, and the width D3 of each vertical notch 22 is larger than the thickness of the substrate W. A pair of projections 25 are formed on respective notch walls 22w on the straight portions 22b of the vertical notch 22. Each pair of projections 25 are effective to secure and support the substrate W.

Preferably, the top surface 25t of each projection 25 is aligned with the slope 22s of the V-shaped top portion 22a of the vertical notch 22 in order to insert the substrate W into the vertical notch 22 without being caught at the boundary between the slope 22s and the top surface 25t of projection 25. The bottom of the vertical notch 22, which is the bottom portion 22c, is upwardly curved or projected to form a curved surface. Accordingly, the contact area of the substrate W and the projections 25 is substantially reduced, and the substrate W is supported by the top point or top line of the bottom portion 22c.

Thus, when the substrates W are lifted with the wafer boat 20 from the rinsing liquid, the rinsing liquid falls through the gaps between the substrates W and respective teeth of the bridge 21A, 21B and then drains along the slopes of the bottom portion 22c.

3. Third Preferred Embodiment

Figure 12:
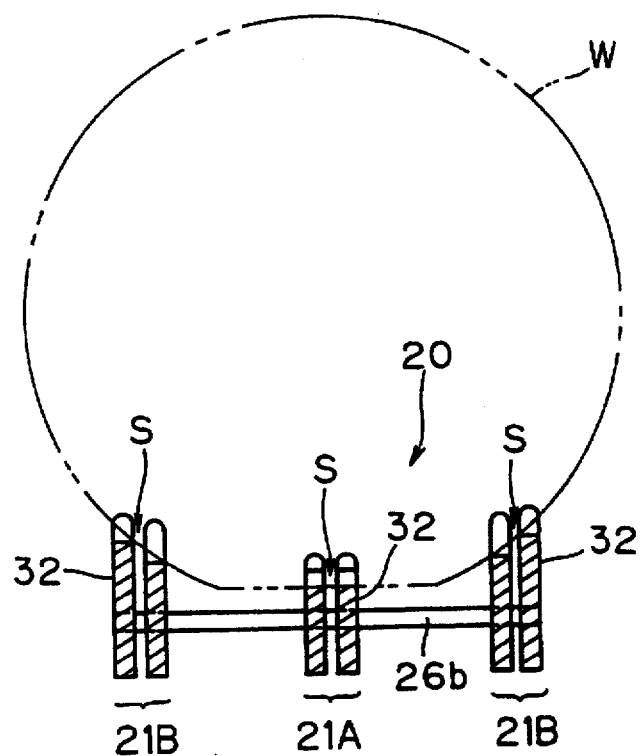
FIG. 12 is a cross-sectional view of a wafer boat according to another preferred embodiment of the present invention.
Figure 13:
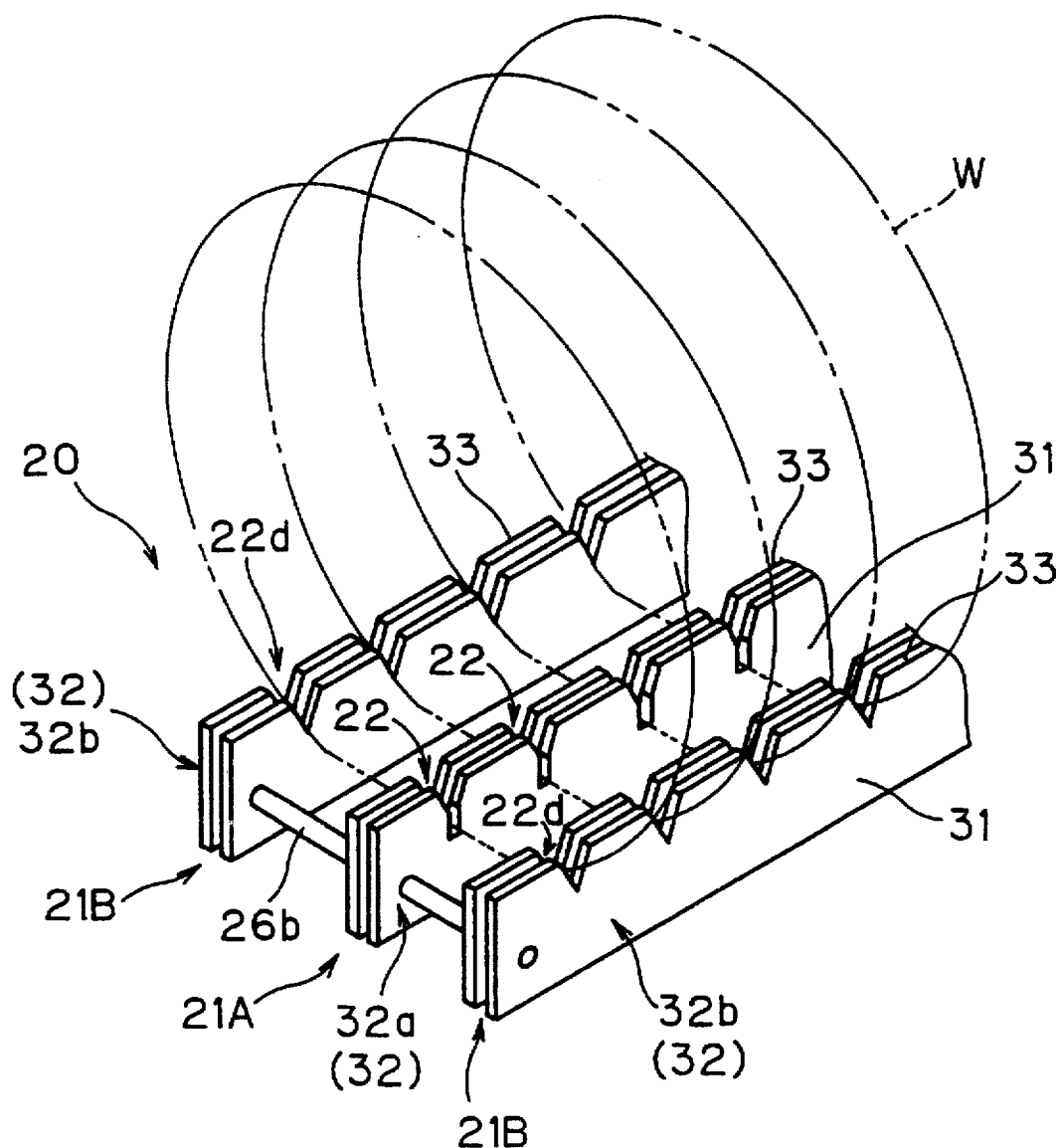
FIG. 13 is a perspective view of the wafer boat of FIG. 12.

FIG. 12 illustrates a cross-sectional view and FIG. 13 is a perspective view of a wafer boat 20 according to a third preferred embodiment of the present invention. The wafer boat 20 has three bridges 21A and 21B for holding a parallel array of upright standing substrates W and the respective ends of the bridges 21A and 21B are connected by rods 26b with gaps therebetween. Each bridge 21A, 21B consists of a pair of thin plates 32 arranged parallel to each other, and a space or gap S is defined between the two plates 32 so that rinsing liquid can drain down through the space S.

As illustrated in FIG. 13, each tooth 33 provided on a plate body 31 of the center bridge 21A defines sloping edges and straight edges, while each tooth 33 of each side bridge 21B defines only sloping edges. All teeth 33 of the bridges 21A and 21B are directed upward. A periodic array of Y-shaped notches 22 are formed on each thin plate 32a of the center bridge 21A, and a periodic array of V-shaped notches 22d are formed on each thin plate 32b of respective side bridges 21B. The substrates W are inserted in the Y-shaped notches 22 and V-shaped notches 22d. The contact between each substrate W and the wafer boat 20 depends on the thickness of only each thin plate 32b, thus the contact area is reduced.

When the substrates W are lifted with the wafer boat 20 from the rinsing liquid, the rinsing liquid drains through the space S and no substantial rinsing liquid remains in the notches 22 and 22d.

4. Fourth Preferred Embodiment

Figure 14:
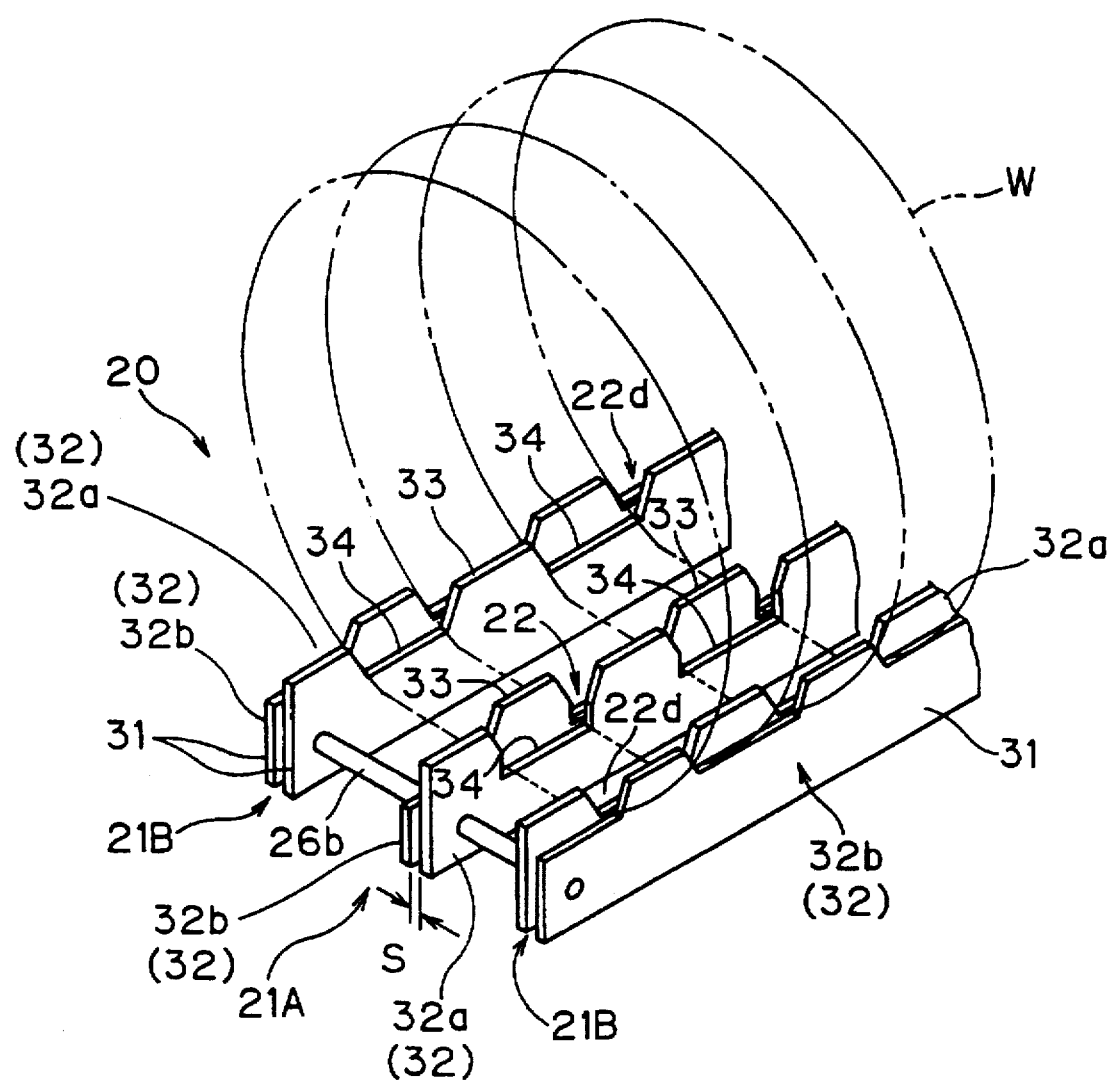
FIG. 14 is a perspective view of a wafer boat according to another preferred embodiment of the present invention.

FIG. 14 is a perspective view of a wafer boat 20 according to a fourth preferred embodiment of the present invention. The wafer boat 20 has three bridges 21A and 21B for holding a parallel array of upright standing substrates W, and the respective ends of the bridges 21A and 21B are connected by rods 26b with gaps therebetween. Each bridge 21A, 21B consists of a pair of thin plates 32 arranged in parallel, and a space or gap S is defined between the two plates 32 so that rinsing liquid can be drained through the space S. Each thin plate 32 has a periodic arrangement of teeth (projections) 33 and valleys (recesses) 34, and the teeth 33 (and likewise the valleys 34) of one thin plate is alternated with respect to the teeth 33 (and the valleys 34) of the other thin plate within each pair of the thin plates 32. All teeth 33 of the bridges 21A and 21B are directed upwardly.

The depth of the valleys 34 of the center bridge 21A is larger than the depth of the valleys 34 of the side bridges 21A. Each tooth 33 of the center bridge 21A defines sloping edges and straight edges, but each tooth 33 of each side bridge 21B defines only sloping edges. The combination of respective teeth 33 in respective pairs of thin plates 32 and the valley 34 therebetween provides a periodic array of Y-shaped notches 22 for holding the substrates W in the center bridge 21A, but those in each side bridge 21B provides a periodic array of V-shaped notches 22d for holding the substrates W.

In the fourth preferred embodiment, the teeth 33 have a period twice the period of holding the substrates W, and are easily manufactured, as compared with the preferred embodiment of FIG. 13. The Y-shaped notches 22 and the V-shaped notches 22d are obtained by arrangement of respective teeth 33 in each pair of thin plates 32 (32a and 32b). The contact area of the substrates W with the bridges 21A and 21B is small, thus rinsing liquid does not remain at the contacts.

5. Fifth Preferred Embodiment

Figure 15:
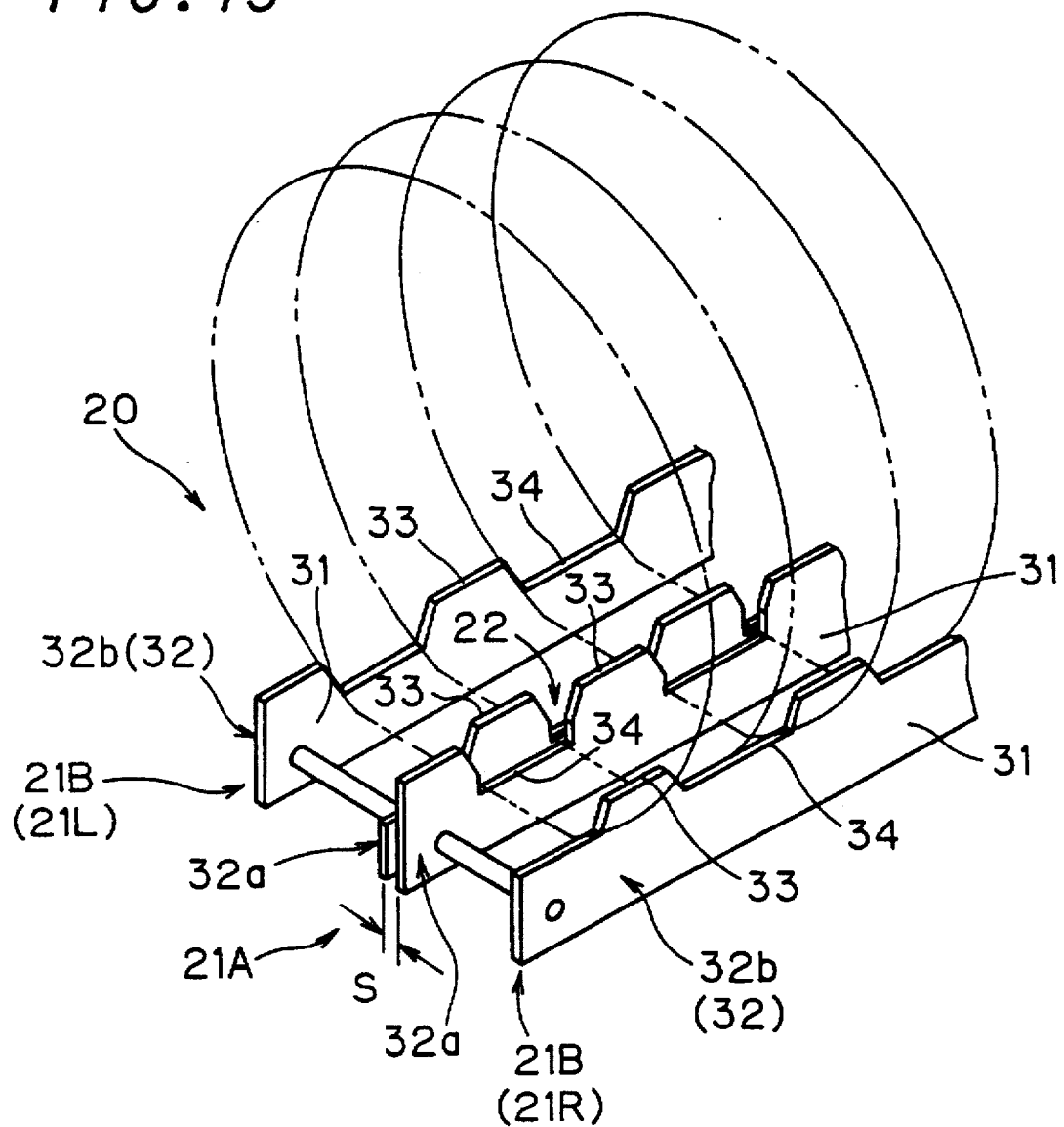
FIG. 15 is a perspective view of a wafer boat according to another preferred embodiment of the present invention.

FIG. 15 illustrates a perspective view of a wafer boat 20 according to a fifth preferred embodiment of the present invention. Only the center bridge 21A consists of a pair of thin plates 32a, whereby Y-shaped notches 22 are formed. Each side bridge 21B (21R, 21L) consists of a single thin plate 32b, and the teeth 33 of thin plate 32b in the right side bridge 21R are alternated with the teeth 33 of thin plate 32b in the left side bridge 21L in order to hold substrates W. All teeth 33 of the bridges 21A and 21B are directed upwardly.

The teeth 33 are easily manufactured and the contact area of the substrates W with the bridges 21A and 21B is small. Rinsing liquids hardly remain at these contact areas.

6. Sixth Preferred Embodiment

Figure 16:
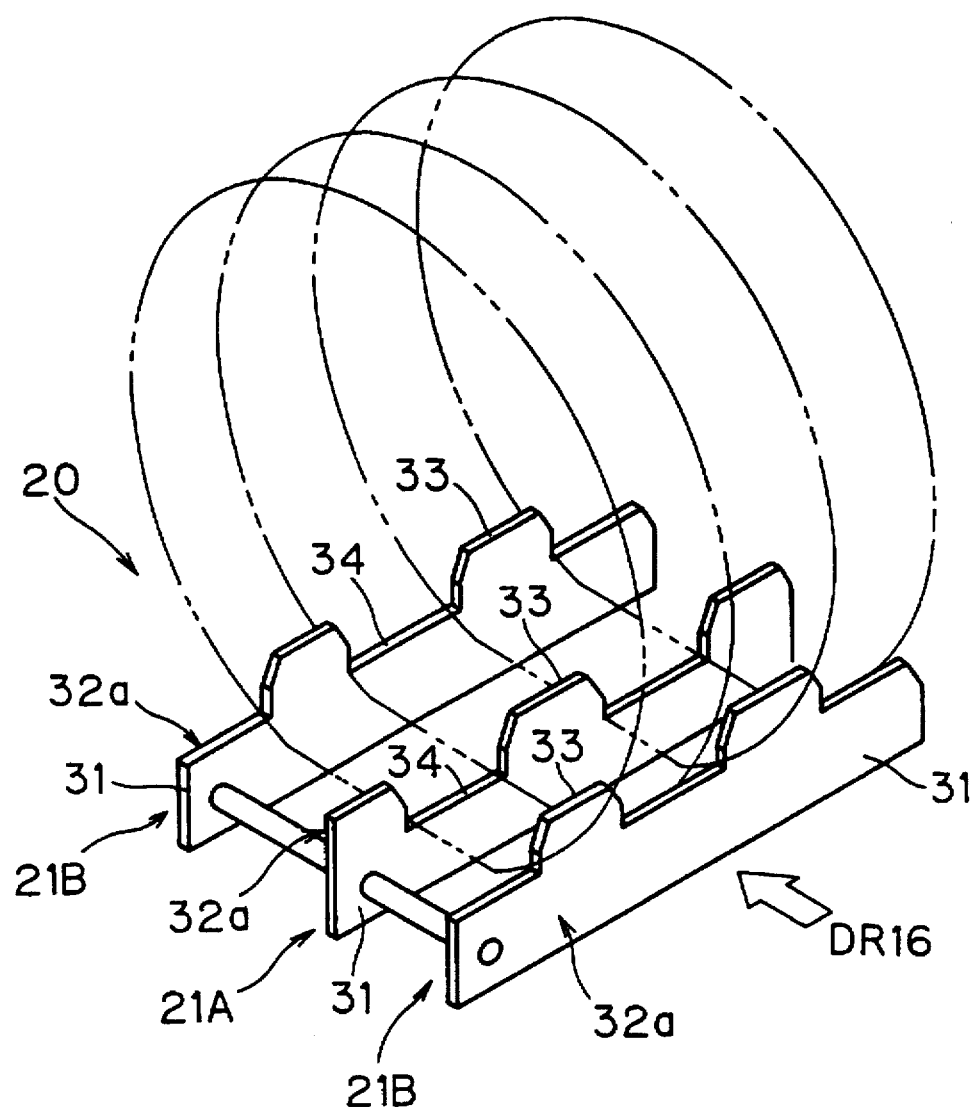
FIG. 16 is a perspective view of a wafer boat according to another preferred embodiment of the present invention.

FIG. 16 illustrates a perspective view of a wafer boat 20 according to a sixth preferred embodiment of the present invention. Each bridge 21A, 21B comprises of a single thin plates 32a. The teeth 33 of the center bridge 21A are alternated with the teeth 33 of the side bridges 21B, so that the resulting arrangement of teeth 33 provides Y-shaped notches when observed from the direction DR16 in FIG. 16. All teeth 33 of the bridges 21A and 21B are directed upwardly. Accordingly, the wafer boat 20 can hold a parallel array of upright standing substrates W.

The wafer boat 20 is easily manufactured and the contact area of the substrates W and the bridges 21A and 21B is small. Rinsing liquids hardly remain at the contact areas.

7. Seventh Preferred Embodiment

7-1. Construction and Function

Figure 17A:
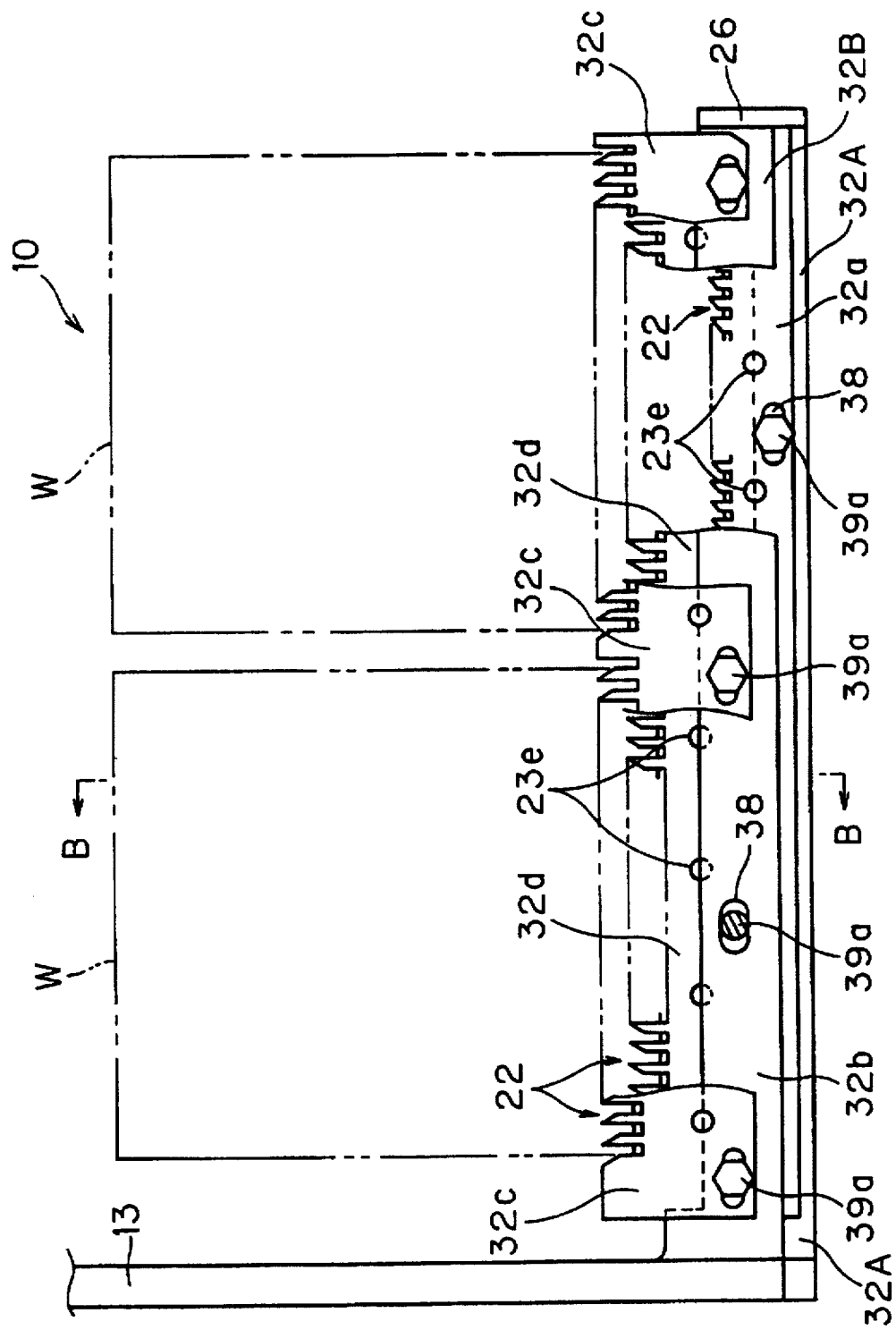
FIG. 17A is a partial side view of a lifter according to another preferred embodiment of the present invention.
Figure 17B:
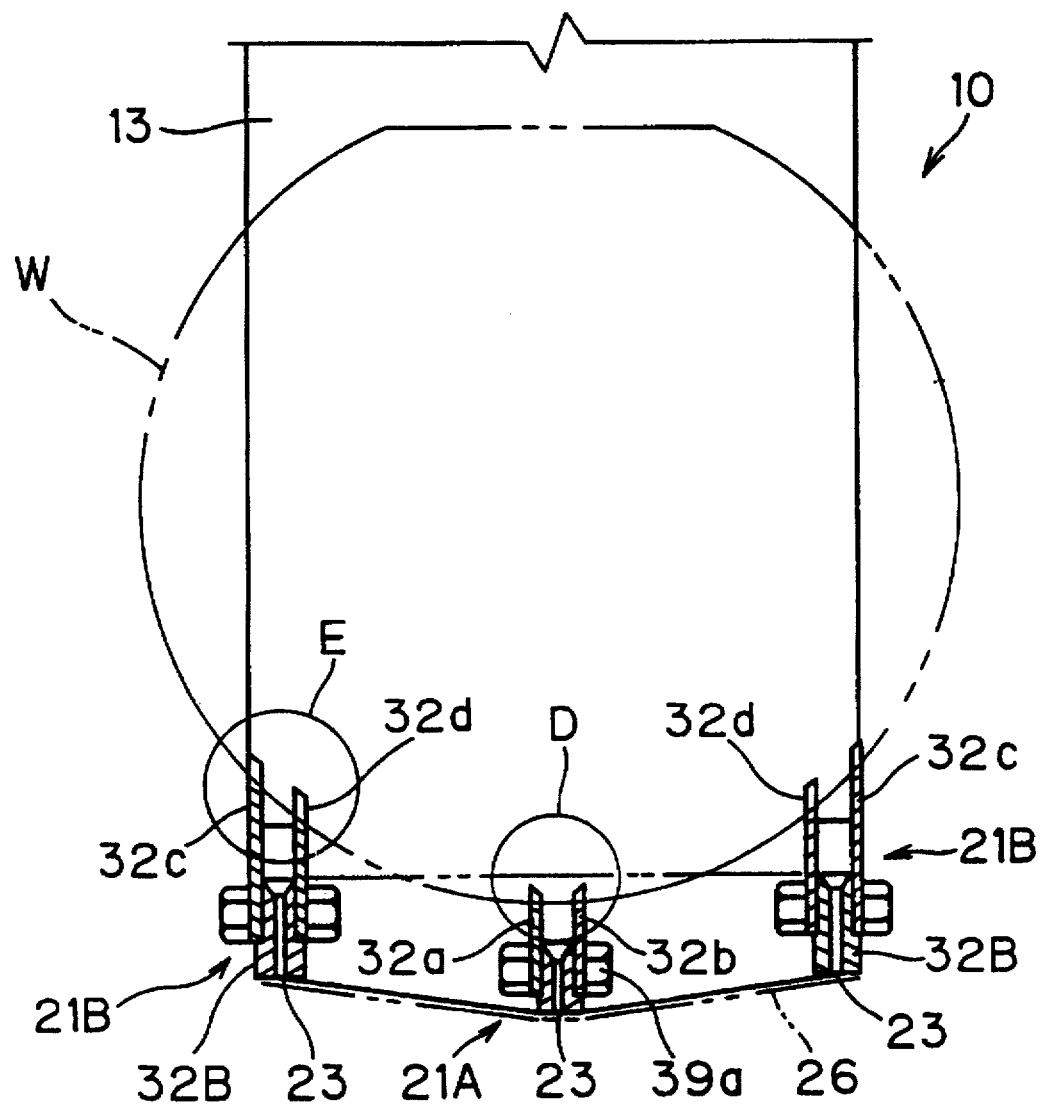
FIG. 17B is a sectional front view at the line B—B in FIG. 17A.
Figure 17C:
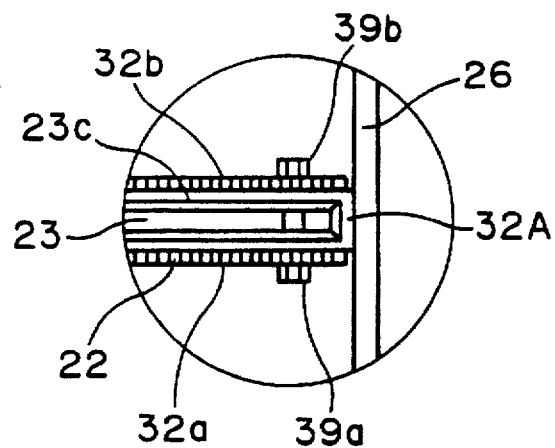
FIG. 17C is an enlarged partial plan view of the top of a center bridge in FIG. 17B.
Figure 17D:
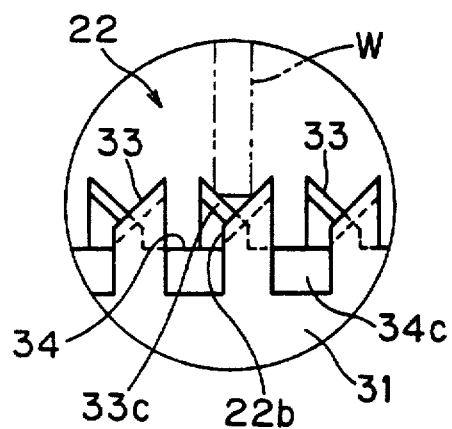
FIG. 17D is an enlarged partial side view of the bottom part D of the center bridge in FIG. 17B.
Figure 17E:
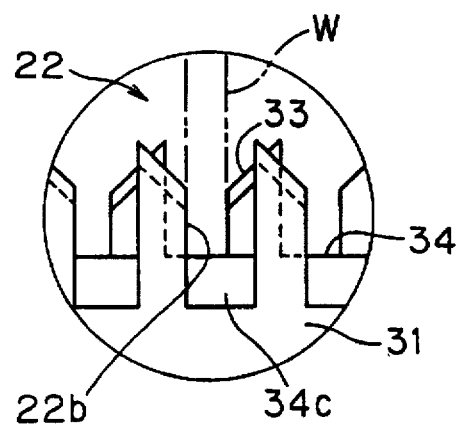
FIG. 17E illustrates an enlarged side view of a part E of a side bridge in FIG. 17B.

FIGS. 17A to 17E illustrate a lifter 10 according to a preferred embodiment of the present invention, in which the lifter 10 is the same type of the lifter shown if FIG. 4. More particularly, FIG. 17A illustrates a partial side view of the lifter 10 with portions broken away; and FIG. 17B is a sectional front view at the line B—B in FIG. 17A. FIG. 17C illustrates an enlarged partial plane view of the top of center bridge 21A in FIG. 17B; FIG. 17D illustrates an enlarged partial side view of the bottom D of the center bridge 21A in FIG. 17B; and FIG. 17E illustrates an enlarged side view of a part E of a side bridge 21B in FIG. 17B.

As shown in FIGS. 17A and 17B, the lifter 10 comprises the center bridge 21A fixed at the bottom center of an L-shaped lift arm 13, and a pair of side bridges 21B are fixed at both sides of the bottom of the lift arm 13. The combination of the center bridge 21A and the side bridges 21B can hold a parallel array of the upright standing substrates W.

The lift arm 13 is made of quartz glass and is coated with anti-corrosion resin. Respective ends of the bridges 21A and 21B are connected with each other by a frame 26. Details of the bridges 21A and 21B are as follows:

First, with reference to FIGS. 17A to 17C, the center bridge 21A comprises a thin supporting member 32A whose one end is fixed to the center bottom of the lift arm 13. Thin plates 32c and 32b are fixed to the supporting member 32A. The other end of the supporting member 32A and that of another thin supporting member 32B, which will be described later, are fixed to the frame 26 to provide rigid structure. As illustrated in FIGS. 17B and 17C, the supporting member 32A is provided with a vent slit 23 running along the elongated direction of the supporting member 32A to drain processing liquid. The supporting member 32A is further provided with slopes 23c around the vent slit 23 to accelerate the draining of the rising liquid.

The thin plates 32a and 32b may be made of fluorocarbon resin, PCTFE (polychlorotrifuoroethylene), PTFE (plytetrafluoroethylene) or the like. The thin plates 32a and 32b define a periodic array of notches 22 having a period corresponding to the array period of the substrates W. As shown in FIGS. 17A and 17C, vertical vent holes 23e and elliptic through holes 38 are formed through the thickness of the thin plates 32a and 32b. The thin plates 32a and 32b are fixed to both sides of supporting member 32A by bolts 39a inserted into the elliptic through holes 38 and connected to nuts 39b, so that the thin plates 32a and 32b stand straight. In installation of the lifter 10, the respective arrangements of the notches 22 on the thin plate 32a and 32b are adjusted in phase by the relative movement of thin plates 32a and 32b in the horizontal and longitudinal directions and by fixing the bolts 39a to the nuts 39b.

As illustrated in FIGS. 17A and 17D, saw-teeth 33 and valleys 34 are alternately formed on the thin plates 32a and 32b, and bevels 33c and 34c are provided on respective tops of the straight portions 22b of the thin plates 32a and 32b in order to accelerate drainage of the processing liquid. As understood from the enlarged side view of FIG. 17D, the thin plates 32a and 32b are partially overlapped and respective ridge lines of respective saw-teeth 33, 33 of the thin plates 32a and 32b cross each other, whereby V-shaped notches 22 are defined. The substrates W are held by points on the ridge lines of the notches 22. Preferably, the straight portions 22b are made long in order to accelerate the release of the processing liquid remaining between the substrates W and the saw-teeth 33 and to reduce the time required for drying.

Details of the side bridge 21B is subsequently described. Each of the side bridges 21B comprises the thin supporting member 32B whose one end is fixed to the bottom end of the lift arm 13. Thin plates 32c and 32b are fixed to the supporting member 32B, and are effective for supporting the side edge of the substrates W. The supporting member 32B and the thin plates 32c and 32d are similar to the supporting member 32A and the thin plates 32a and 32b of the center bridge 21A. In installation of the lifter 10, the thin plates 32c and 32d can be moved in the horizontal and longitudinal direction of the thin plates 32c and 32d provided on both sides of the supporting member 32B to adjust the width of and gaps between the Y-shaped notches 22 defined by the thin plates 32c and 32d.

As illustrated in FIGS. 17A and 17E, the thin plates 32c and 32d are arranged such that the respective ridge lines of saw-teeth 33, 33 of the thin plates 32c and 32d cross each other, whereby the Y-shaped notches 22 are defined, as observed from the sides (see FIG. 17E). The substrates W are held at the straight portions 22b of the Y-shaped notches 22 and the bottoms of valleys 34. Thus, the combination of the bridges 21A and 21B can hold a parallel array of the upright standing substrates W.

According to the preferred embodiment of FIGS. 17A to 17E, the drainage of the processing liquid is accelerated when the lifter 10 holding the substrates W is lifted from the processing liquid, and the time required for drying after the surface processing of the substrates W is reduced, since:

1) the vent holes or slits 23 are formed through the supporting members 32A and 32B in the vertical direction;

2) the slopes 23c are formed around the vent slit 23 on the supporting members 32A and 32B; and 3) the vertical vent holes 23e are formed through the thickness of the thin plates 32a to 32d.

Further, the elliptic through-holes 38 formed through the thickness of the thin plates 32a to 32d make it possible to adjust relative arrangements in each pair of the thin plates 32a and 32b (32c and 32d) in the horizontal or longitudinal direction to relative positions of the notches 22 of both sides. Through these adjustments, both Y-shaped notches and V-shaped notches are obtained as the notches 22 without prior dedication of certain members for Y-shaped notches and other members for V-shaped notches. Accordingly, respective notches 22 can be obtained from a single type of the thin plates, and thus, it is possible to reduce the costs.

7-2. First Modification of Bridges

Figure 18:
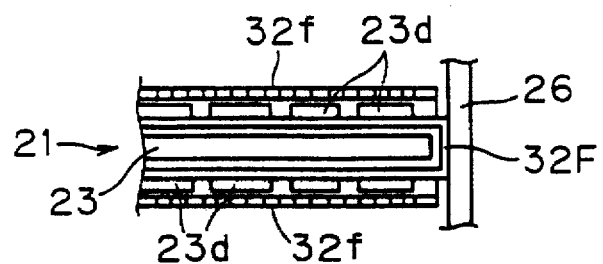
FIG. 18 illustrates a modification of the bridges.

FIG. 18 illustrates a first modification of the bridges, as compared with those of FIG. 17A. In the first modification, thin plates 32f are fixed to a thin supporting member 32F across vent spaces 23d to accelerate drainage of the processing liquid. The remaining construction of the bridge is similar to that shown in FIGS. 17A to 17E. The structure of FIG. 18 can be obtained by inserting a washer between the thin plate 32a, 32b and the supporting plate 32A (FIGS. 17A to 17d), respectively, when the thin plate 32a, 32b is connected to the supporting plate 32A with bolts 39a and nuts 39b.

7-3. Second Modification of Bridges

Figure 19:
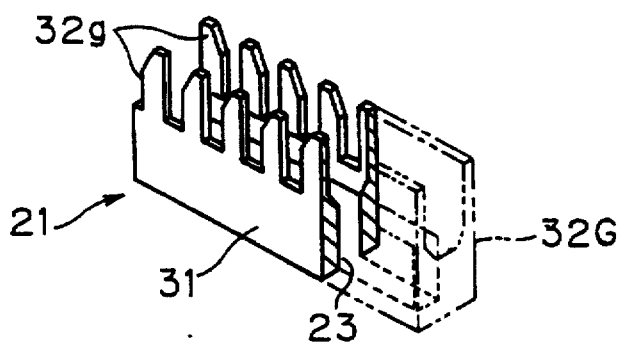
FIG. 19 illustrates another modification of bridges.

FIG. 19 illustrates a second modification of the bridges, as compared with those of FIG. 17A. Respective thin plates 32g are united with a thin supporting member 32G and a vent slit 23 is formed in the supporting member 32G to accelerate drainage of processing liquid.

In the first and second modifications, the processing liquid hardly remains on the bridge 21 and the time required for drying after the surface processing of the substrates W is reduced.

7-4. First Modification of Thin Plates

Figure 20A:
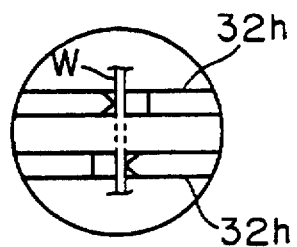
FIG. 20A is a partial plan view of a modification of the thin plates.
Figure 20B:
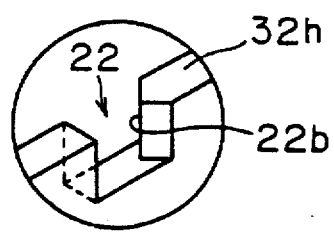
FIG. 20B is a partial perspective view of the modification.

FIGS. 20A and 20B illustrate a first modification of the thin plates, wherein FIG. 20A is a partial plan view and FIG. 20B is a partial perspective view. Bevels 22b are formed on a straight portion 22c of each thin plate 32h for holding a substrate W, and the edge of the bevels 22b contacts the substrate W.

7-5. Second Modification of Thin Plates

Figure 21A:
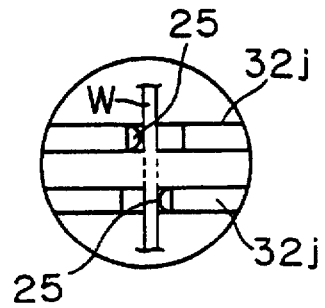
FIG. 21A is a partial plan view of another modification of the thin plates.
Figure 21B:
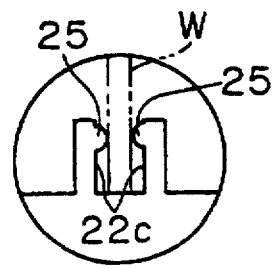
FIG. 21B is a partial side view of the modification.

FIGS. 21A and 21B illustrate a second modification of the thin plates, wherein FIG. 21A is a partial plan view and FIG. 21B is a partial side view. Projections 25, similar to those in FIGS. 11A and 11B, are formed on straight portions 22c to contact the substrate W. The remaining construction of the plates is the same as FIGS. 17A to 17E.

In the first and second modifications, the contact area between the straight portions 22b and the substrate W is small. As a result, the portion of the substrate W not subjected to the processing liquid is substantially reduced, and the quality of surface processing of the substrates W is improved.

8. Eighth Preferred Embodiment

Figure 22:
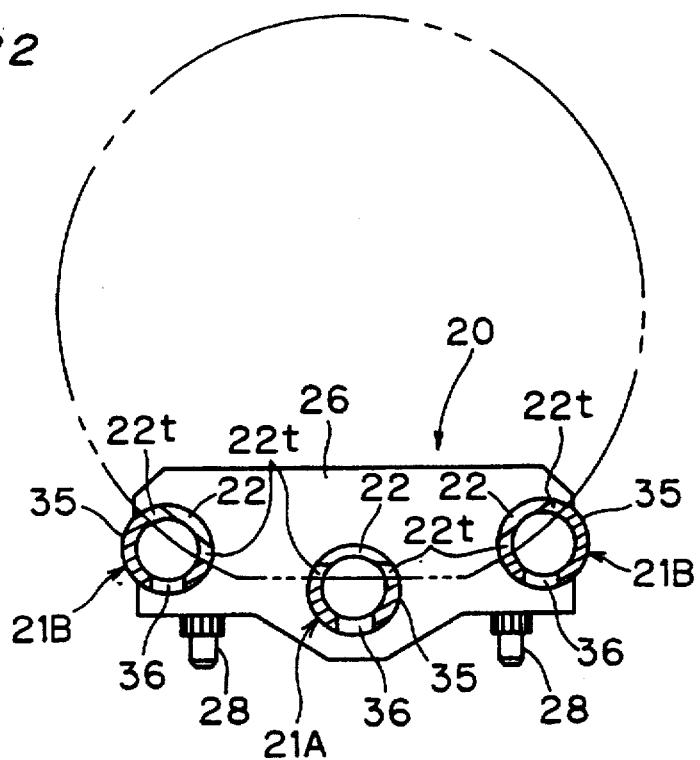
FIG. 22 illustrates a wafer boat comprising other bridges according to another preferred embodiment of the present invention.

FIG. 22 illustrates a wafer boat comprising another construction of bridges according to an eighth preferred embodiment of the present invention. A wafer boat 20 comprises three bridges 21A and 21B for holding a parallel array, of upright standing substrates W. The respective ends of the bridges 21A and 21B are connected to each other by a frame 26.

Each of the bridges 21A and 21B is a horizontal tube 35 on which a periodic array of Y-shaped notches 22 is formed. The Y-shaped notches 22 open to the inner space of the tube 35 and vent holes 36 are formed through the bottom of the tube 36.

According to the preferred embodiment of FIG. 22, the substrates W are held by small arc portions 22t of the notches 22 and the contact area between the substrates W and notches 22 is small. Processing liquid barely remains in the notches 22 when the substrates W are lifted from the processing liquid.

In place of the tubes 35, horizontal half tubes or long arches may be employed to obtain bridges 21A and 21B. In this case, a periodic array of Y-shaped notches are formed through the arches of the horizontal half tubes. No vent holes are required since the Y-shaped notches themselves open to the bottom space.

9. Ninth Preferred Embodiment

Figure 23:
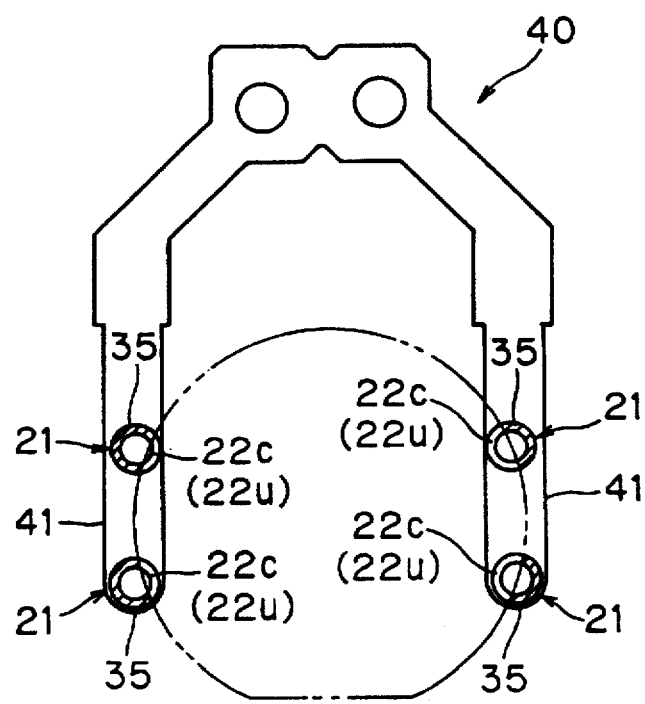
FIG. 23 illustrates a wafer chuck according to another preferred embodiment of the present invention.

FIG. 23 illustrates a wafer chuck 40 according to a ninth preferred embodiment of the present invention, in which tubes 35 similar to those of FIG. 22 are employed. The wafer chuck 40 comprises a pair of arms 41 and four bridges 21, two of which are fixed to each arm 41. The wafer chuck 40 can hold a parallel array of the upright standing substrates W, and is used to dip the substrates W into processing liquid and then lift up the substrates W, for example.

Each of the bridges 21 is formed of the tube 35. A periodic array of V-shaped notches 22c are formed on a portion of the tube 35 facing toward the substrate W so as to open to the inner space of the tube 35.

According to the preferred embodiment of FIG. 23, the substrates W are held by small arc portions 22u of the notches 22 and the contact area between the substrates W and notches 22 are small. Processing liquid barely remains in the notches 22 when the substrates W are lifted from the processing liquid.

As in the modification of the embodiment of FIG. 22, horizontal half tubes or long arches may be employed in place of the tubes 35, to obtain bridges 21A and 21B. Also, the bridges 21A and 21B of FIGS. 5 to 17E may be employed in place of the bridges 21.

10. Tenth Preferred Embodiment

Figure 24:
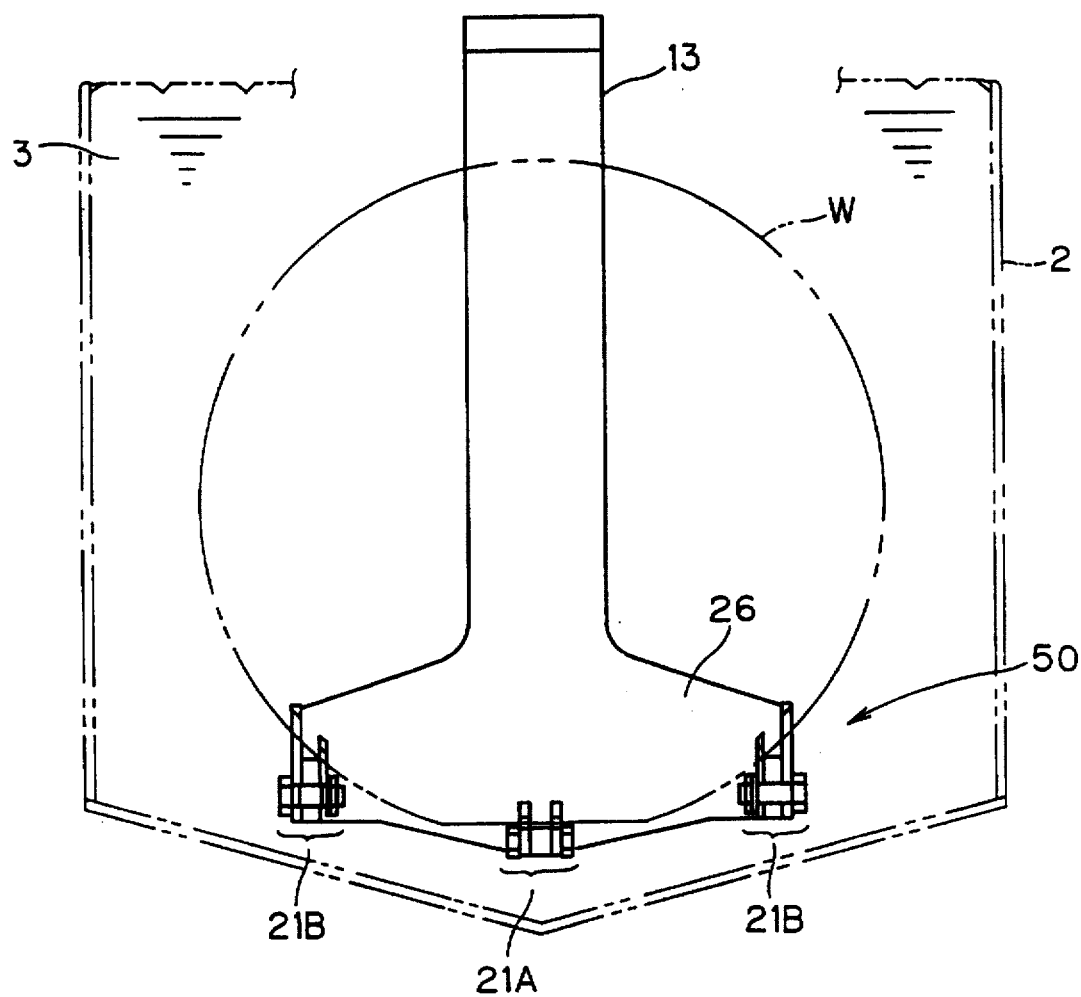
FIG. 24 illustrates a wafer holder according to another preferred embodiment of the present invention.
Figure 25:
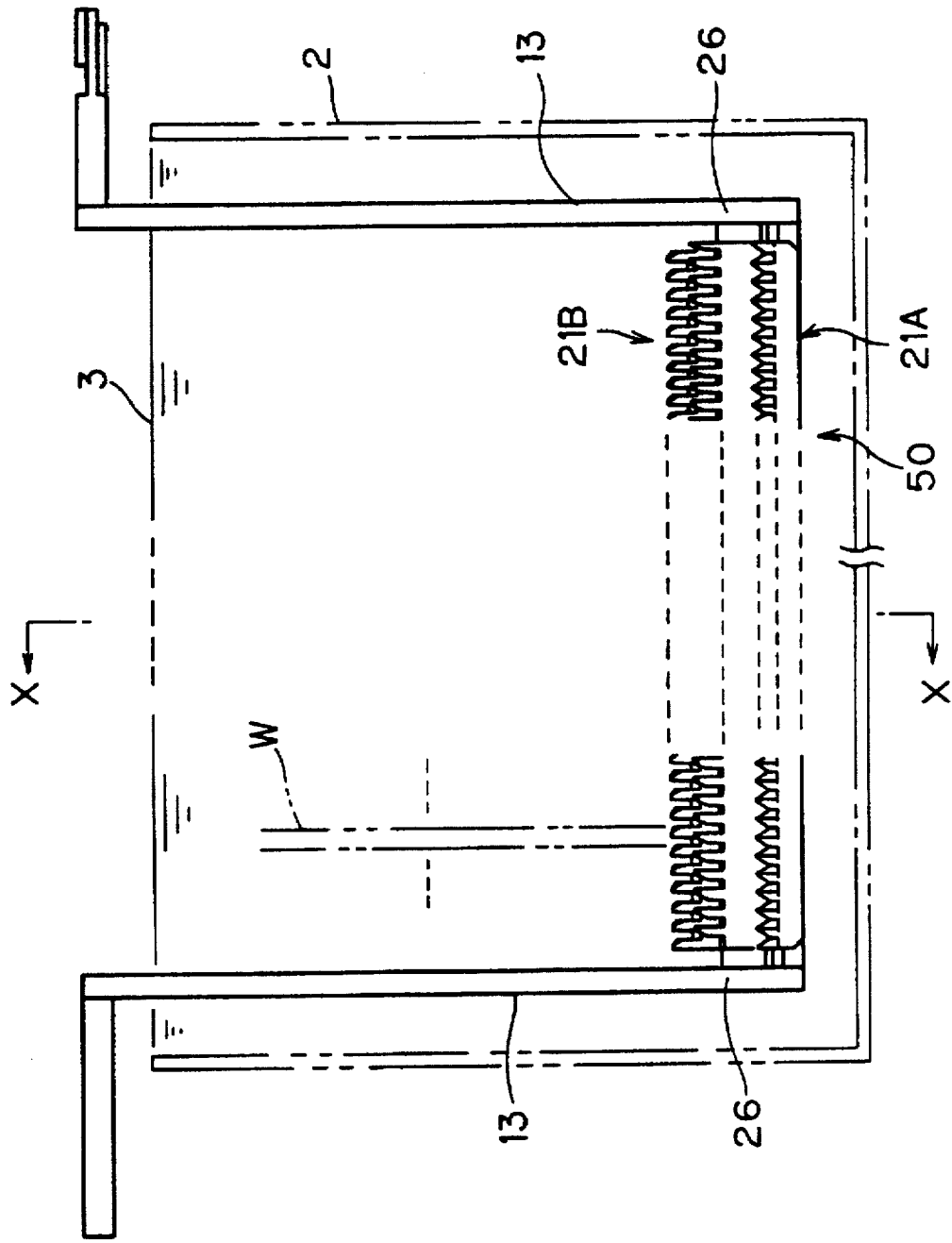
FIG. 25 is a front sectional view corresponding to FIG. 24.

FIG. 24 illustrates a wafer holder 50 according to a tenth preferred embodiment of the present invention. FIG. 24 corresponds to a sectional view taken along the X—X line of FIG. 25. The wafer holder 50 has arms 13 and frames 26 to which bridges 21A and 21B are attached for holding a parallel array of upright standing substrates W. The wafer holder 50 is provided in a processing bath 2 of an overflow type to process the substrates W in processing liquid 3.

Figure 26:
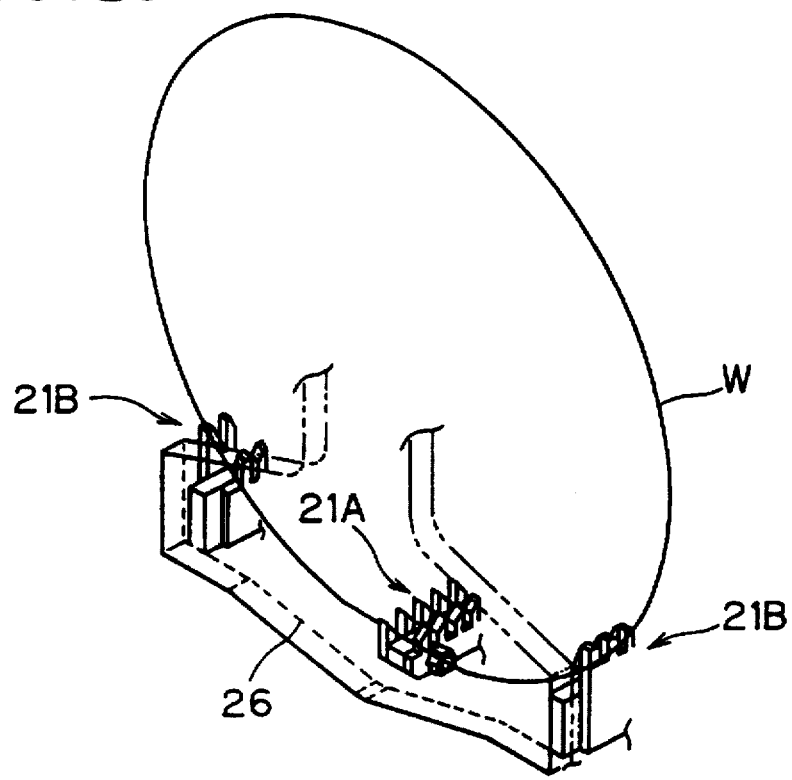
FIG. 26 is a partial perspective view of the bridges.
Figure 27:
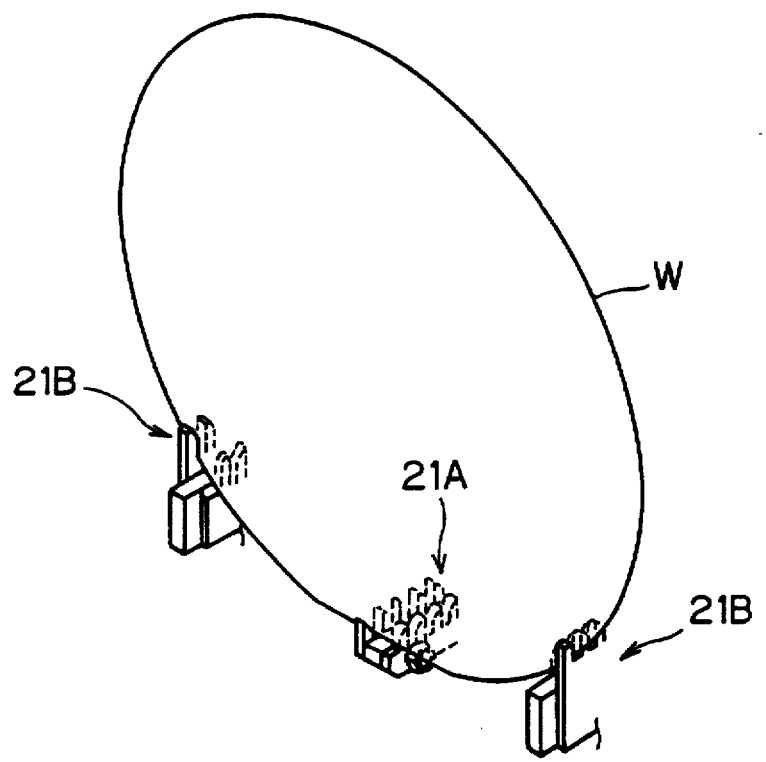
FIG. 27 is a partial perspective view of the bridges.

The bridges 21A and 21B are illustrated in FIG. 26 as a partial perspective view. The bridges 21A and 21B are connected to each other by the frames 26. FIG. 27 illustrates another arrangement of the bridges 21A and 21B, wherein the bridges 21A and 21B are not linked by frames but are directly placed on or fixed to the bottom of the processing bath 2 of FIG. 24.

FIG. 28A illustrates details of the center bridge 21A, and FIGS. 28B and 28C illustrate details of the left side bridge 21L and the right side bridge 21R of side bridges 21B. The right side bridge 21R is symmetrical with the left side bridge 21L, and therefore, only the center bridge 21A and the left side bridge 21L will be described. The center bridge 21A comprises a pair of thin plates 32e and 32f, with a spacer 51 inserted therebetween. Each of the thin plates 32e and 32f has a periodic alternating array of saw-teeth 33 and valleys 34. Slopes or bevels 22d are formed at the tops of the saw-teeth 33. The saw-teeth 33 of the thin plate 32e are shifted in position from the saw-teeth 33 of the thin plate 32f and the bevels of the thin plate 32e are in the opposite side of the bevels of the thin plate 32f. Accordingly, Y-shaped notches 22 are defined by the thin plates 32e and 32f when observed from the direction D28, in FIG. 28A. The substrates W are inserted into the Y-shaped notches 22.

With reference to FIG. 28B, the left side bridge 21L (21B) includes a pair of thin plates 32m and 32n having a periodic alternating array of saw-teeth 33 and valleys 34. A spacer 52 is inserted between the thin plates 32m and 32n. Slopes or bevels 22d are also formed at the tops of the saw-teeth 33. The relative arrangement of the saw-teeth 33 between the thin plates 32m and 32n is similar to that of FIG. 28A, so that Y-shaped notches 22 are defined by the thin plates 32m and 32n. The right side bridge 21R of FIG. 21C is the mirror image of that of FIG. 21B.

The substrates W are held in notches 22 of bridges 21A and 21B. The edge WE of substrate W contacts the sides of the teeth and the bottom of the valleys 34 of the side bridges 21B, while the edge WE contacts only the sides of the teeth and does not contact the bottom of the valleys 34 of the center bridge 21A.

Although the wafer holder 50, according to the tenth preferred embodiment, is not used to lift the substrates W, the wafer holder 50 is advantageous in that the contact area between substrates W and bridges 21A and 21B is small, and circulation of the processing liquid is improved. As a result, impurities in the processing liquid are scarcely found at the contacts and contamination of the substrates W is prevented.

11. Other Modifications

The substrate holder according to the present invention may be embodied so that substrates are held in any arrangements other than the ones illustrated. The position and the number of bridges are also arbitrary.

The present invention may be applied to a substrate holder for holding a periodic array of glass substrates for liquid-crystal displays.

While the invention has been shown and described in detail, the foregoing description is in all aspects illustrative and not restrictive. It is therefore understood that numerous modifications and variations can be devised without departing the scope of the invention.

We claim:

1. A substrate holder for holding substrates standing straight to process respective surfaces of said substrates with said substrates having first and second major surfaces, said substrate holder comprising:

a) a first plate on which first teeth directed up and defining first valleys between said first teeth are formed;

b) a second plate on which second teeth directed up and defining second valleys between said second teeth are formed; and c) a third plate on which third teeth directed up and defining third valleys between said third teeth are formed; wherein said second and third plates are arranged in parallel, said first plate is inserted between said second and third plates in parallel to said second and third plates, said second and third valleys are aligned with each other in the direction of parallelism of said first, second and third plates and said first valleys are staggered with respect to said second and third valleys in the direction of parallelism so that said substrates are capable of being held by said first to third plates such that said first major surfaces are supported by walls of said first valleys only, and said second major surfaces are supported by walls of said second and third valleys only.

2. A substrate holder, comprising: bridges arrayed in parallel for holding substrates so as to process respective surfaces of said substrates, each of said bridges having, a) a bridge body; and b) teeth arrayed on said bridge body and said teeth defining valleys therebetween, said valleys capable of receiving said substrates, and side recesses disposed on at least one side of said bridge body and said teeth such that steps are defined between said side recesses and walls of said valleys.

3. A substrate holder, comprising: bridges arrayed in parallel for holding substrates so as to process respective surfaces of said substrates, each of said bridges having, a) a bridge body;

b) teeth arrayed on said bridge body and said teeth defining valleys therebetween, said valleys capable of receiving said substrates, and c) projections provided on walls of said valleys, said projections protruding toward opposing walls of said valleys, and respective widths of said valleys being larger than respective thicknesses of said substrates capable of being received in said valleys.

4. A substrate holder, comprising: bridges arrayed in parallel for holding substrates so as to process respective surfaces of said substrates, at least one of said bridges having, a) a plurality of plates adapted to stand vertically upright and arranged in parallel, each of said plurality of plates having a plate body, and teeth arrayed on said plate body and defining Y-shaped or V-shaped valleys between said teeth, said valleys capable of receiving said substrates; and b) means for defining gaps between said plurality of plates smaller than gaps between said bridges.

5. The substrate holder of claim 3, wherein each of said bridges further includes vent holes at the bottoms of said valleys, each vent hole having a diameter larger than a thickness of a substrate capable of being received in said valley.

6. The substrate holder of claim 4, for holding substrates having first major surfaces and second major surfaces, respectively, said plurality of plates including:

a first plate having first teeth defining first valleys between said first teeth, each of said first valleys having a width larger than the width of said substrates, and a second plate having second teeth defining second valleys between said second teeth, each of said second valleys having a width larger than the width of said substrates, said first and second valleys are staggered with respect to each other, and are adapted so that each substrate is supported only by one of said first teeth and a corresponding one of said second teeth.

7. The substrate holder of claim 6, wherein said first teeth have first straight portions defining walls of said first valleys and adapted for contacting said first major surfaces of said substrates, and said second teeth have second straight portions defining walls of said second valleys and adapted for contacting said second major surfaces of said substrates.

8. The substrate holder of claim 7, wherein said first teeth further have first slope portions provided on said first straight portions and adapted for defining first clearances from said substrates, and said second teeth further have second slope portions provided on said first straight portions and adapted for defining second clearances from said substrates.

9. The substrate holder of claim 7, wherein said first straight portions have first bevels to define first surfaces adapted for contacting said first major surfaces of said substrates, and said second straight portions have second bevels to define second surfaces adapted for contacting said second major surfaces of said substrates.

10. The substrate holder of claim 7, wherein said first straight portions have first projections adapted for contacting said first major surfaces of said substrates, and said second straight portions have second projections contacting said second major surfaces of said substrates.

11. The substrate holder of claim 6, wherein said first teeth partially overlap said second teeth, said first teeth have first top slopes inclined to a first direction, and said second teeth have second top slopes inclined to a second direction, and said first top slopes and said second top slopes are adapted to support said substrates at edge points of said substrates.

12. The substrate holder of claim 4, wherein said first plate is movable relative with respect to said second plate in a direction along each bridge.

13. The substrate holder of claim 4, wherein through holes are formed in said first and second plates.

14. The substrate holder of claim 1, wherein said bridges are disposed in said substrate holder so as to be capable of holding substrates in a vertically upright position.

15. The substrate holder of claim 1, wherein said valleys are generally V-shaped.

16. The substrate holder of claim 1, wherein said valleys are generally Y-shaped.

17. The substrate holder of claim 3, wherein said projections are capable of contacting said substrates substantially at points.

18. The substrate holder of claim 3, wherein said valleys are generally Y-shaped, said projections are provided on straight portions of said walls, and top surfaces of said projections are aligned with surfaces of slope portions of said walls.

* * * * *